US00RE38296E

(19) United States
(12) Reissued Patent
Moriuchi et al.

(10) Patent Number: US RE38,296 E
(45) Date of Reissued Patent: Nov. 4, 2003

(54) SEMICONDUCTOR MEMORY DEVICE WITH RECESSED ARRAY REGION

(75) Inventors: Noboru Moriuchi, Chofu (JP); Yoshiki Yamaguchi, Hyogo (JP); Toshihiko Tanaka, Tokyo (JP); Norio Hasegawa, Hinode-machi (JP); Yoshifumi Kawamoto, Shiroyama-machi (JP); Shin-ichiro Kimura, Tokyo (JP); Toru Kaga, Hachioji (JP); Tokuo Kure, Hinode-machi (JP)

(73) Assignee: Hitachi, Ltd., Tokyo (JP)

(21) Appl. No.: 08/408,788

(22) Filed: Mar. 23, 1995

Related U.S. Patent Documents

Reissue of:
(64) Patent No.: 5,196,910
Issued: Mar. 23, 1993
Appl. No.: 07/650,999
Filed: Feb. 4, 1991

U.S. Applications:
(60) Continuation of application No. 07/401,616, filed on Aug. 31, 1989, now abandoned, which is a division of application No. 07/184,786, filed on Apr. 22, 1988, now Pat. No. 4,882,289.

(30) Foreign Application Priority Data

Apr. 24, 1987 (JP) ..... 62-99741

(51) Int. Cl.[7] ..... H01L 27/108; H01L 29/76; H01L 23/48; H01L 23/52

(52) U.S. Cl. ..... 257/296; 257/306; 257/379; 257/750; 257/754; 257/758; 257/371; 257/390; 257/510; 257/734

(58) Field of Search ..... 257/296, 306, 257/371, 379, 390, 510, 734, 506, 750, 754, 758; 437/5; 438/210

(56) References Cited

U.S. PATENT DOCUMENTS

| | | | | | |
|---|---|---|---|---|---|
| 4,641,166 | A | * | 2/1987 | Takemae et al. | 257/306 |
| 4,675,716 | A | * | 6/1987 | Jones | 257/618 |
| 4,677,739 | A | * | 7/1987 | Doering et al. | 438/228 |
| 4,696,092 | A | * | 9/1987 | Doering et al. | 437/5 |
| 4,845,544 | A | * | 7/1989 | Shimizu | 257/296 |
| 4,906,588 | A | * | 3/1990 | Harrington, III | 257/371 |
| 4,929,565 | A | * | 5/1990 | Parrillo | 257/321 |

FOREIGN PATENT DOCUMENTS

| | | | | |
|---|---|---|---|---|
| CA | 0930477 | * | 7/1973 | 257/369 |
| DE | 2904812 | * | 8/1979 | 257/296 |
| JP | 54-107278 | * | 8/1979 | 257/296 |
| JP | 55-65455 | * | 5/1980 | 257/335 |
| JP | 56-43753 | * | 4/1981 | 257/297 |
| JP | 59-54260 | * | 3/1984 | 257/903 |
| JP | 59-61072 | * | 4/1984 | 257/306 |
| JP | 59-130462 | * | 7/1984 | 257/296 |
| JP | 60-37766 | * | 2/1985 | 257/310 |
| JP | 61-32567 | * | 2/1986 | 257/297 |
| JP | 61-287258 | * | 12/1986 | 257/304 |
| JP | 62-81750 | * | 4/1987 | 257/296 |

* cited by examiner

*Primary Examiner*—Steven Loke
(74) *Attorney, Agent, or Firm*—Antonelli, Terry, Stout & Kraus, LLP

(57) ABSTRACT

A semiconductor memory wherein a memory cell region having a plurality of memory cells and a relatively high altitude above the surface of semiconductor substrate is formed at a recessed part of the semiconductor substrate having the recessed part and a projected part, and wherein a peripheral circuit region having a comparatively low altitude from the surface of the semiconductor substrate is formed at the projected part of the semiconductor substrate.

44 Claims, 15 Drawing Sheets

SEMICONDUCTOR MEMORY DEVICE WITH RECESSED ARRAY REGION

Matter enclosed in heavy brackets [ ] appears in the original patent but forms no part of this reissue specification; matter printed in italics indicates the additions made by reissue.

This application is a *reissue application of application Ser. No. 07/650,999, filed Feb. 4, 1991, now U.S. Pat. No. 5,196,910, which is a* continuation of application Ser. No. 401,616, filed Aug. 31, 1989 now abandoned, which is a divisional of application Ser. No. 184,786, filed Apr. 22, 1988, now U.S. Pat. No. 4,882,289.

BACKGROUND OF THE INVENTION

The present invention relates to a semiconductor memory and method for manufacturing the same and particularly to a large scale integrated semiconductor memory and method for manufacturing the same suitable for employment of optical lithography method.

Integration degree of a semiconductor memory is now in the age of 1 Mbits and a 4 Mbits memory is also under the development. Improvement in integration degree has been supported mainly by an ultraminiaturized pattern formation technology, namely the lithography and etching techniques. Therefore, it is very important to acquire the throughput as the lithography technology. For this reason, a reduction projection lithography using optical lenses has been widely employed as a method to form an ultraminiaturized pattern with comparatively high throughput. However, this reduction projection lithography provides a problem that when resolution of lens increases, depth of focus becomes shallow because the light is used and resolution is deteriorated if the surface which becomes the focusing surface (substrate surface is not flat. The optical lithography is explained in the "VLSI Device Handbook", P139 to 141, issued on Nov. 28, 1983, by Science Forum Co., Ltd.

Meanwhile, as far as element structure is concerned, it is more complicated and the level difference formed on the substrate becomes large. It is because, for example, in the case of DRAM (Dynamic Random Access Memory), a capacitor having a capacitance value larger than the specified value must be formed as a measure for soft error to the $\alpha$-ray and thereby a stacked capacitor, etc. is used to form a capacitor having a large capacity within a narrow region. (A cell structure using such capacitor is called a stacked capacitor type memory cell (STC memory cell).) This STC memory cell is disclosed in the Published Japanese Patent No. 61-55258.

As explained above, in the reduction projection lithography technology to form an ultraminiaturized pattern, the substrate surface must be formed flat because the depth of focus is shallow. However, in actuality, since there is a large level difference on the substrate as described above, focusing goes out of the depth of focus, resulting in a problem that pattern resolution is deteriorated or size accuracy is lowered.

In order to solve such problems as pattern resolution fault or drop of size accuracy resulting from the level difference on the substrate, a multilayer resist method has been proposed. This multilayer resist method is disclosed, for example, in the Japanese Laid-open patent No. 51-107775. In the case of this method, a flat surface which is not almost effectuated by level difference of substrate is formed with a thick organic film (BL: Bottom Layer) on the substrate having the level difference. Moreover, a shielding layer and a mask layer are sequentially formed thereon, the mask layer is patterned at the upper most layer by the photolithography technology and the shielding layer is etched with the patterned mask layer used as the mask. In addition, with this shielding layer used as the mask, the organic film as the lowest layer is etched by the anisotropic etching such as the sputter etching or ion beam etching, and the layer to be processed is etched with such organic film of the lowest layer used as the mask. Here, a substrate includes a single crystal silicon substrate and insulation film and conductive layer, etc. formed on the surface thereof.

SUMMARY OF THE INVENTION

The inventors of the present invention have found that the multilayer resist method explained above is certainly effective as a measure for the case where level difference exists in the crowded region and also found a problem in this method that a pattern resolution fault or size accuracy deterioration is generated in the memory array region or peripheral circuit region in case level difference is formed between the memory cell array region and peripheral circuit region exists, namely altitude difference exists between regions separated in a certain degree, for example, like the DRAM having the STC memory cell. This problem may be thought to be generated because even if a multilayer resist method is used, altitude difference between the memory array region and peripheral circuit region cannot be eliminated and this altitude difference causes that the surfaces of memory array region and peripheral circuit region are not simultaneously set within the depth of focus of the reduction projection lithography apparatus. According to experiments by inventors of the present invention, in case the altitude difference between two regions is about 1.5 $\mu$m and these regions are separated by 30 to 40 $\mu$m or more, it is difficult even in the multilayer resist method to eliminate such altitude difference.

It is therefore an object of the present invention to provide a technology to process both regions with high accuracy, even if these regions are processed simultaneously, in case these regions are separated by the specified difference and have altitude difference.

It is another object of the present invention to provide a technology to simultaneously process the memory cell array region and peripheral circuit region of a semiconductor memory.

It is another object of the present invention to provide a semiconductor memory wherein a memory cell array region is formed in the recessed part of single crystal silicon substrate and the peripheral circuit region is formed in other part.

The aforementioned and other objects and novel features of the present invention will become apparent from description of this specification and accompanying drawings.

A typical invention among those disclosed in the present application will be summarized and briefly explained hereunder.

Pattern resolution fault of the memory cell array region and peripheral circuit region can be prevented because these are processed within the depth of focus of the exposing apparatus in the exposure process by forming the region which is higher than the semiconductor substrate surface in the finished condition, for example, the memory array region to the recessed part of single crystal semiconductor substrate and the region which is lower than the semiconductor substrate surface under the finished condition, for example, the peripheral circuit region to the other part, with the small altitude difference between the memory cell array region and peripheral circuit region.

DESCRIPTION OF THE PREFERRED EMBODIMENT

Figure 1:
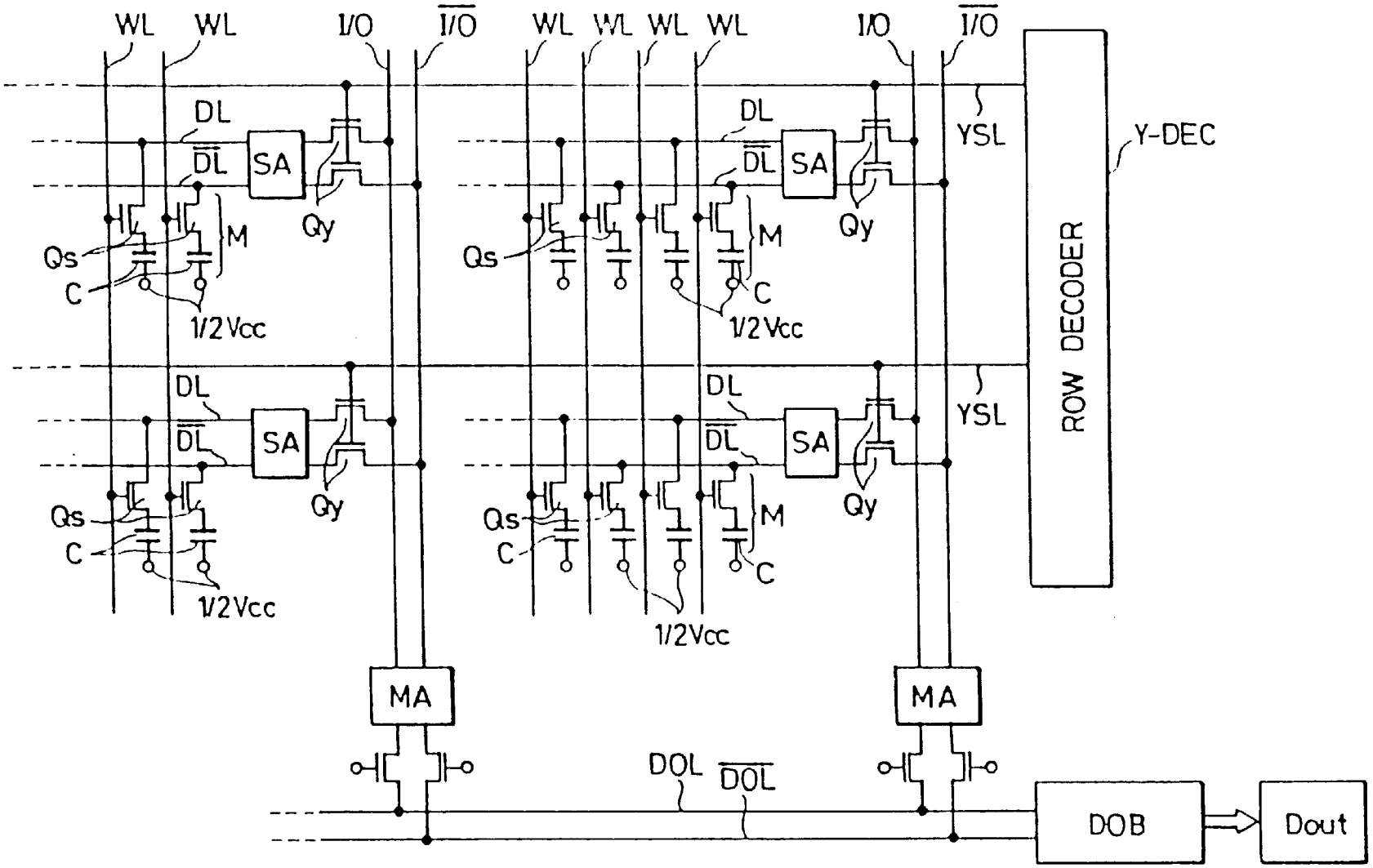
FIG. 1 is an equivalent circuit of essential portion of a dynamic RAM to which the present invention is adopted.

As shown in FIG. 1, a DRAM is formed by the folded bit line system. A memory cell array (memory cell mat) is arranged at the center of FIG. 1.

This memory cell array permits the complementary data lines DL, $\overline{DL}$ to extend in the column direction. This complementary data line DL is arranged in a plurality of pairs in the row direction. These complementary data lines DL are connected to the sense amplifiers SA respectively at the one end side.

Meanwhile, the word lines WL are extended in the row direction crossing the complementary data lines DL. The word line WL is also arranged in a plurality of lines in the column direction. Although not illustrated, respective word lines WL are connected with the row decoder circuits X-DEC arranged at the end part of memory cell array for selection.

At each cross point of the one complementary data line DL and the one word line WL, a memory cell M to store the information of 1 [bit] is arranged. The memory cell M is formed by an n-channel MISFET $Q_s$ for memory cell selection and an information accummulating capacitance element C of which one electrode is connected in series to the one semiconductor region of such MISFET.

The MISFET $Q_s$ of memory cell M is connected to the complementary data line DL through the other semiconductor region and also connected to the word line WL through the gate electrode. The other electrode of information accummulating capacitance element C is connected with a power supply voltage ½ $V_{cc}$. The power supply voltage ½ $V_{cc}$ is an intermediate voltage between the reference voltage $V_{ss}$ (=0 [V]) of the circuit and power supply voltage $V_{cc}$ (=5 [V]) of the circuit. The power supply voltage ½ $V_{cc}$ applied to the other electrode reduces a field intensity to be applied across the information accummulating capacitance element C and thereby lowers deterioration of dielectric strength of a dielectric material film.

The sense amplifier SA explained above is so formed as amplifying information of memory cell M to be transmitted through the complementary data line DL. The information amplified by sense amplifier SA is then output to the common data lines I/O, $\overline{I/O}$ through the n-channel MISFET $Q_y$ as Y switch.

The MISFET $Q_y$ as Y switch is so formed that the gate electrode thereof is connected to the Y select signal line YSL for control. The one Y select signal YSL is provided for a pair of complementary data lines DL. The Y select signal lines YSL are extended in the same column direction as the complementary data lines DL and are arranged between respective complementary data lines DL. In other words, the complementary data lines DL and Y select signal lines YSL are alternately arranged in the row direction. The Y select signal lines YSL are so formed as being connected with the column decoder circuits Y-DEC arranged at the end part of memory cell array for selection.

The common data lines I/O are connected to the main amplifiers MA arranged at the end part of memory cell array. The main amplifier MA is connected to an output transistor $D_{out}$ through MISFET for switching (sign is not attached), output signal lines DOL, $\overline{DOL}$and data output buffer circuit DoB. Namely, the information of memory cell which has been further amplified by the main amplifier MA is output to the output transistor $D_{out}$ through the output signal lines DOL and data output buffer circuit DoB, etc.

Next, practical structures of elements forming memory cell M of DRAM and peripheral circuits (sense amplifier SA, column decoder circuit Y-DEC, etc.) of DRAM are explained hereunder.

Figure 2:
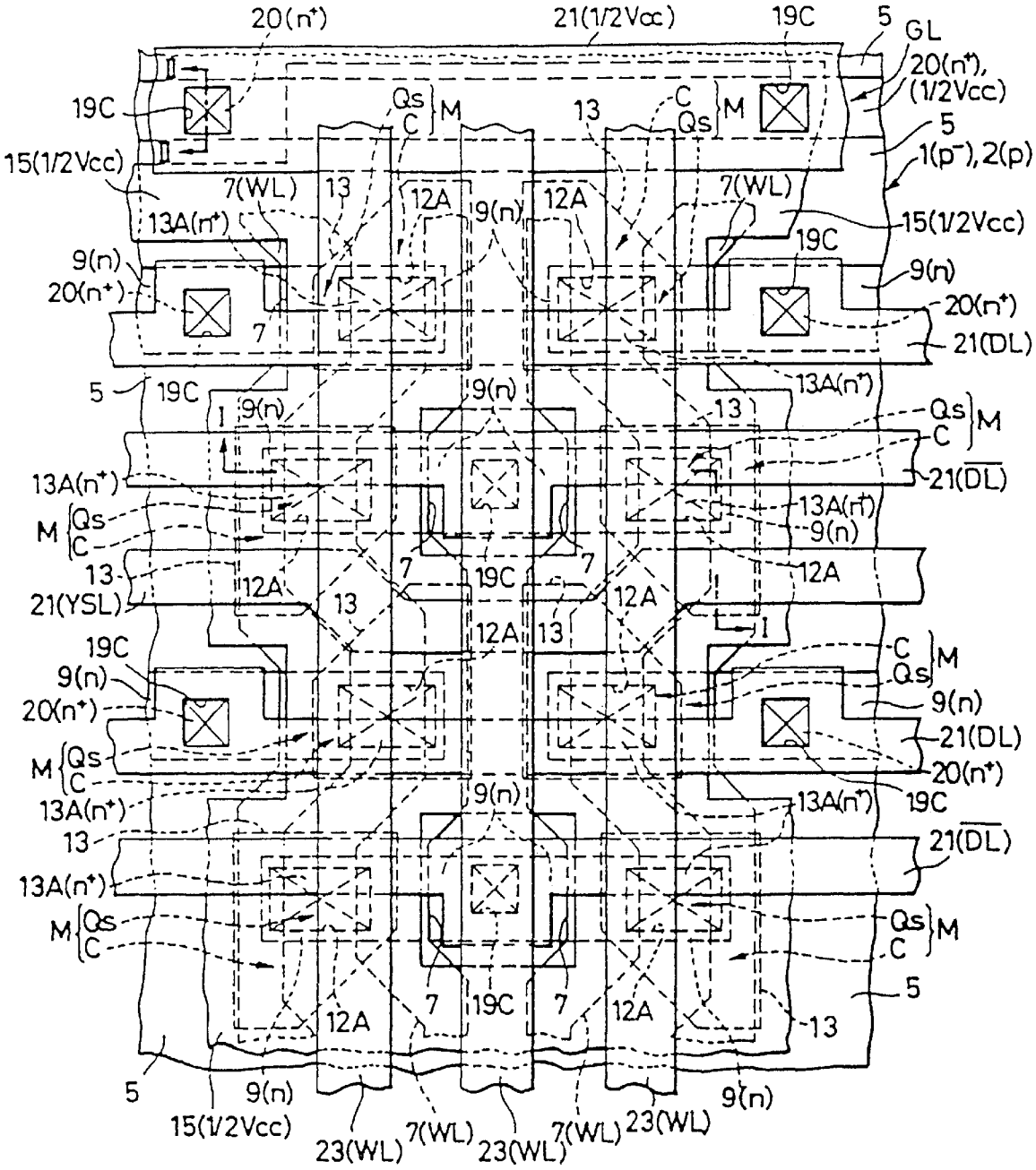
FIG. 2 is a layout of memory cell part of dynamic RAM to which the present invention is adopted.
Figure 3:
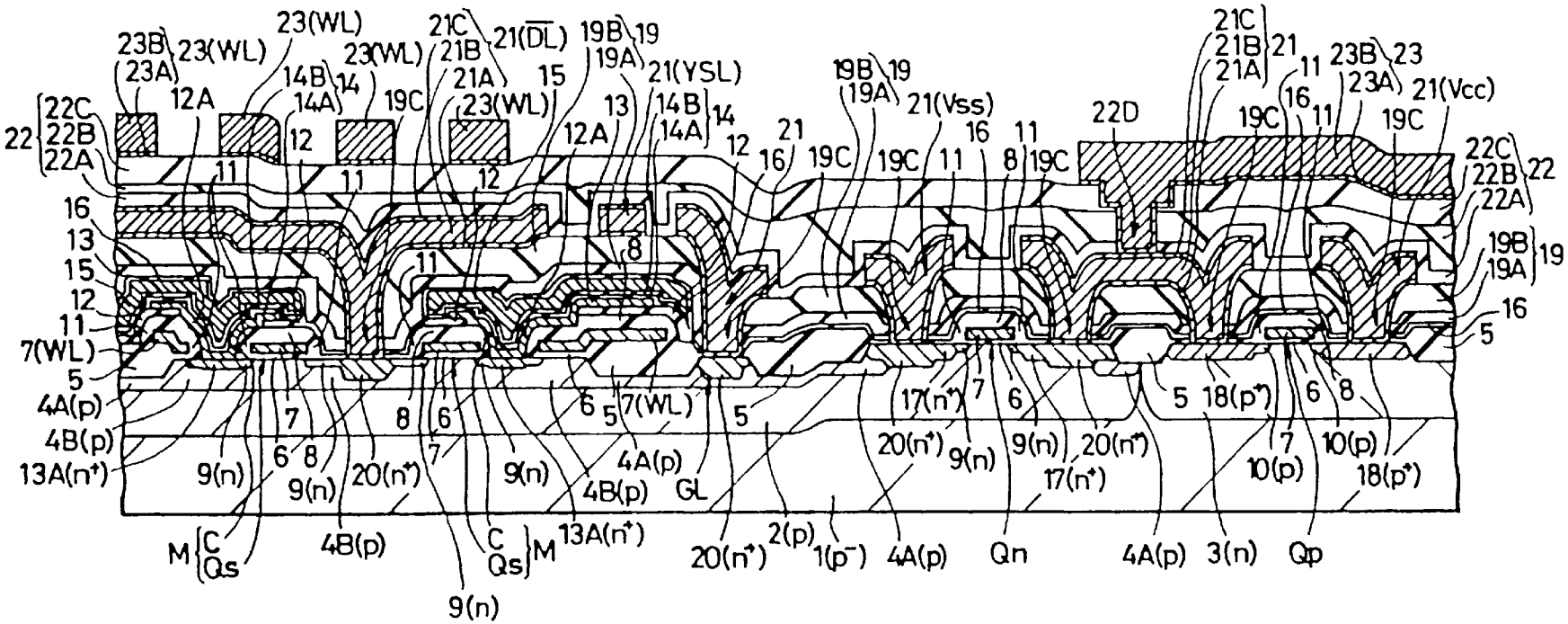
FIG. 3 is a sectional view of the memory cell part and the peripheral circuit part of dynamic RAM to which the present invention is adopted.
Figure 4:
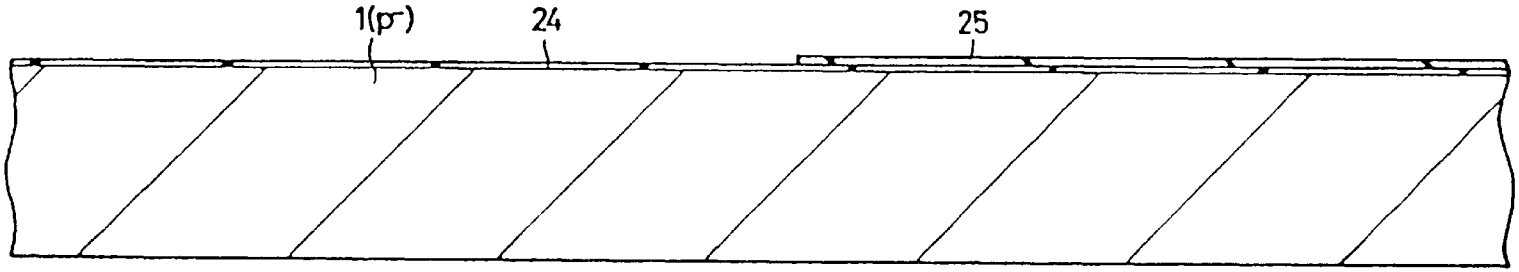
FIGS. 4 to 23 are sectional views of the essential portion indicating each manufacturing process of the memory cell part and peripheral circuit part.

The memory cell array of DRAM is indicated in FIG. 2 (plan view of the essential portion) and elements of memory cell array and peripheral circuits are indicated in FIG. 3 (sectional view of essential portion). The left side of FIG. 3 is the sectional view of memory cell M along the cutting line I—I of FIG. 2 and the center area of FIG. 3 is the sectional view of guard ring portion along the cutting line II—II of FIG. 2. The right side of FIG. 3 is the sectional view of complementary MISFET (CMOS) forming the peripheral circuits.

As indicated in FIG. 2 and FIG. 3, the DRAM is made of single crystal silicon and is formed by the P-type semiconductor substrate 1 comprising the recessed part in the region to form the memory cell M. Meanwhile, a p-type well region 2 is provided to the main surfaces of the memory cell M (memory cell array) forming region and n-channel MISFET$Q_n$ forming region on the semiconductor substrate 1. An n-type well region 3 is also provided to the main surface of the p-channel MISFET forming region $Q_p$ of the semiconductor substrate 1. Namely, the DRAM of the present invention employs the twin well structure.

An element separating insulation film (field insulation film) 5 is provided on the main surface defined between respective semiconductor element forming regions of well regions 2, 3. This element separating insulation film 5 is formed to electrically separate semiconductor elements. A p-type channel stopper region 4A is provided on the main surface of well region 2 under the element separating insulation film 5. Since a parasitic MOS using such element separating insulation film 5 as a gate insulation film is easily inverted to the n-type, the channel stopper region 4A is provided at least to the main surface of well region 2.

A p-type potential barrier layer 4B is provided to the main surface of the memory cell M forming region of the well region 2. The potential barrier layer 4B is substantially provided to the entire part of memory cell M forming region. As will be explained later, this potential barrier layer 4B is formed in the same manufacturing process and with the same manufacturing mask as those of the channel stopper region 4A. This potential barrier layer 4B is formed by extending and diffusing the p-type impurity (B) introduced to the channel stopper region forming region up to the memory cell M forming region.

The memory cell selection MISFET$Q_s$ of memory cell M is formed, as indicated in FIG. 2 and FIG. 3, to the main surface of the well region 2 (in actual, the potential barrier layer 4B). The MISFET$Q_s$ region is surrounded by the element separating insulation film 5 and channel stopper region 4A to define the shape thereof. This MISFETQ$_s$ is basically and mainly formed by a well region 2, a gate insulation film 6, a gate electrode 7, and a pair of n-type semiconductor regions 9 as the source regions or drain regions.

The well region 2 is used as the channel forming region of MISFETQ$_s$.

The gate insulation film 6 is formed by a silicon oxide film formed oxidizing the main surface of well region 2.

The gate electrode 7 is provided at the upper part of gate insulation film 6 and formed, for example, by polycrystal silicon film deposited by the CVD method. This polycrystal silicon film introduces an n-type impurity (P or As) which lowers a resistance value.

The gate electrode 7 may also be formed by a single layer of high melting point metal (Mo, Ti, Ta, W) film or high melting point metal silicide ($MoSi_2$, $TiSi_2$, $TaSi_2$, $WSi_2$) film. Moreover, the gate electrode 7 can also be formed by a composite film obtained by laminating metal film on the polycrystal silicon film.

This gate electrode 7 is structured together with the word lines (WL) extending in the row direction as indicated in FIG. 2. Namely, the gate electrode 7 and word lines 7 are formed by the same conductive layer. The word lines 7 connect the respective gate electrodes 7 of MISFETQ$_s$ of a plurality of memory cells M arranged in the row direction.

The semiconductor region 9 is formed by the ion implantation of low impurity concentration, at least, in the one side for connecting information accummulating capacitance element C in comparison with the semiconductor region (17) of MISFETQ$_s$ forming the peripheral circuits. In practical, the one semiconductor region 9 is formed by ion implantation of impurity concentration as low as under $1\times10^{14}$[atoms/cm$^2$]. This semiconductor region 9 formed by ion implantation of impurity in concentration as low as under $1\times10^{14}$ [atoms/cm$^2$] includes less crystal defect generated on the main surface of well region 2 resulting from implantation of impurity and is capable of sufficiently recovering such crystal defect by the heat processing after doping of impurity.

The semiconductor region 9 is formed by self-alignment for the gate electrode 7. Since this semiconductor region 9 is formed in the channel forming region side with low impurity concentration, it forms MISFETQ$_s$ of LDD (Lightly Doped Drain) structure.

As indicated in FIG. 2 and FIG. 3, the information accummulating capacitance element C of memory cell M is mainly formed by sequentially stacking a first electrode layer (lower electrode layer) 13, a dielectric material film 14 and a second electrode layer (upper electrode layer) 15. The information accummulating capacitance element C is formed by so-called stacked structure (stacking type: STC).

A part (central region) of the first electrode layer 13 of the information accummulating capacitance element C of stacked structure is connected to the one semiconductor region 9 of MISFETQ$_s$. This connection is carried out through a connecting hole 12A formed to an interlayer insulation film 12. An aperture size in the column direction of the connecting hole 12A is larger than the distance between the side wall spacers 11 provided to the side walls of the gate electrode 7 of MISFETQ$_s$ and the word line 7 adjacent thereto. Therefore, the substantial aperture size of connecting hole 12A is regulated by distance between the side wall spacers 11. Difference between the aperture size of connecting hole 12A and the distance between side wall spacers 11 is larger than at least the amount corresponding to the allowance for making in the manufacturing process. The other part (peripheral part) of the first electrode layer 13 is extended up to the respective upper portions of gate electrode 7 and word lines 7 through coexistence of the side wall spacers 11 and interlayer insulation film 8.

The first electrode layer 13 is formed by the polycrystal silicon film to which the n-type impurity (As or P), for example, is doped in high concentration to reduce a resistance value. The n-type impurity doped to the polycrystal silicon film forms an n+ type semiconductor region 13A of high impurity concentration which is diffused into the side of the one semiconductor region 9 from the connecting part of the first electrode layer 13 and said one semiconductor region 9 defined by the side wall spacers 11 and is integrally formed with said semiconductor region 9.

The other part of the first electrode layer 13 is guided in the row direction (upper or lower direction) from the region defined by a pair of complementary data lines (21) DL. Namely, the first electrode layer 13 is guided to the outer region from the memory cell M forming region surrounded by the element separating insulation film 5. This first electrode layer 13 is separated from the first electrode layer 13 (formed by the same conductive layer) of the information accummulation capacitance element C of other adjacent memory cell M in the row direction in order to avoid contact and the plane is formed into a pentagonal shape in this embodiment. This first electrode layer 13 is formed in such a manner as extending up to the position overlapping the Y select signal line (21) YSL in the row direction adjacent to the complementary data line (21) DL to which the memory cell M comprising the electrode layer is connected. In actual, since the Y select signal line (21) YSL is formed as the upper layer on the first electrode layer 13, the first electrode layer 13 is formed as the lower layer in such a way as extending up to the position under the Y select signal line (21) YSL.

The dielectric material film 14 is basically formed by the double layer structure stacking a silicon nitride film 14A deposited by the CVD method as the upper layer on the first electrode layer (polycrystal silicon film) 13 and then forming thereon a silicon oxide film 14B which is obtained by oxidizing such silicon nitride film 14A under high pressure ambience. Actually, the dielectric material film 14 is formed by the triple layer structure sequentially stacking a naturally oxidized silicon film (not illustrated because it is formed as thin as under 50[Å]), a silicon nitride film 14A and a silicon oxide film 14B because the naturally oxidized silicon film is formed on the surface of polycrystal silicon film (the n-type impurity is doped) used as the first electrode layer 13.

The silicon nitride film 14A of the dielectric material film 14 is deposited by the CVD method and therefore it is not effectuated by crystal condition or stepped condition of the polycrystal silicon film (first electrode layer 13) of the base layer and can be formed under the process condition independent of the base layer. In other words, since the silicon nitride film 14A shows higher dielectric strength and less number of defects in the unit area in comparison with the silicon oxide film formed by oxidizing the surface of polycrystal silicon film, a leak current is very low level. Moreover, the silicon nitride film 14A characteristically has a high dielectric constant in comparison with silicon oxide film. Since the silicon oxide film 14B can be formed by very good quality film, it can further improve the characteristics of the silicon nitride film 14A. As will be explained later, since the silicon oxide film 14B is formed by high pressure oxidation (15~10 [torr]), the time required for oxidation, namely the heat processing time can be curtailed in comparison, with that required for oxidation under normal pressure.

The dielectric material film 14 is provided at the surface of first electrode layer 13 and along the side wall and is extending in area in the perpendicular direction by making use of the side wall region of the first electrode layer 13. Increase in area of dielectric material film 14 results in improvement in amount of accummulation of charges by information accummulating capacitance element C of the stacked structure. The shape of plane of this dielectric material film 14 is specified by the shape of a second electrode layer 15 as the upper layer and is substantially formed in the same shape as the second electrode layer 15.

The second electrode layer 15 is provided at the upper part of the first electrode layer 13 in such a manner as covering it through existence of the dielectric material film 14. This second electrode layer 15 is formed together with the second electrode layer 15 of the information accummulating capacitance element C of the adjacent other memory cell M. The power supply voltage ½ $V_{cc}$ is applied to this second electrode layer 15. This electrode layer 15 is formed, for example, by the polycrystal silicon film to which the n-type impurity is doped in order to reduce a resistance value.

The memory cell M thus structured is connected to another adjacent memory cell M in the column direction. The connection is established by integrally forming the other semiconductor regions 9 of respective memory cell selection $MISFETQ_s$ of memory cell M.

The other semiconductor region 9 of $MISFETQ_s$ of memory cell M is connected with the complementary data lines (DL) 21. These complementary data lines (DL) 21 are connected to the semiconductor region 9 through the connecting hole 19C formed to the interlayer insulation film 19.

As indicated in FIG. 2 and FIG. 3, an n+ type semiconductor region 20 with high impurity concentration is provided to the connecting part of complementary data lines 21 and semiconductor region 9. The semiconductor region 20 is formed by doping an n-type impurity (As or P) by the ion implantation method through the connecting hole 19C. Namely, the semiconductor region 20 is formed together with the semiconductor region 9. The semiconductor region 20 is provided to prevent short-circuit between well region 2 and complementary data line 21 which is often generated when the connecting hole 19C shows masking deviation to the semiconductor region 9 in the manufacturing process and thereby the hole 19C partly engages with the end part of element separating insulation film 5.

This interlayer insulation film 19 is formed in such a double layer structure that the silicon oxide film 19A and silicon oxide film which realizes glass flow (BPSG) 19B are stacked. The silicon oxide film 19B as the upper layer is formed so that the flat surface can be formed through the glass flow. The lower silicon oxide film 19A is provided to acquire dielectric strength and prevent leak of boron or phosphorus doped to the silicon oxide film 19B as the upper layer into the element.

The complementary data line 21 is formed in the triple layer structure wherein a barrier metal film 21A (metal wiring), an aluminum film 21B (metal wiring) and a protection film 21C (metal wiring) are sequentially stacked.

The aluminum film 21B allows addition of an element (Si) for preventing aluminum spike and an element (Cu or Pd or Ti, etc.) for reducing migration. The aluminum film 21B of the present embodiment is formed by adding Si of about 1.5 [wt %] and Cu of about 0.5 [wt %]. The barrier metal film 21A is formed to prevent precipitation of single crystal silicon to the connecting point between the aluminum film 21A and the semiconductor region (in actual, semiconductor region 20) and resultant increase of resistance value at the connecting point. This barrier metal film 21A is formed by $MoSi_2$. In addition, this barrier metal film 21A may be formed by high melting point metal silicide or high melting point metal film in addition to such materials.

The protection film 21C is so structured as to protect the aluminum film 21B from the liquid to be used for the wet processing to form the aluminum film 21B (for example, peeling solution process to remove the photoresist film as the etching mask or water cleaning process). The aluminum film 21B adding the element (Cu) to lower the migration has the structure of a battery wherein the mother material aluminum is used for anode and an intermetallic compound formed by aluminum and Cu is used for cathode. This battery shows battery reaction with the liquid used for such wet processing. The protection film 21C is formed to prevent such battery reaction. In case the battery reaction is generated, the peripheral aluminum is cut away with the intermetallic compound used as the core.

The protection film 21C has the structure indicated by MoSix. Moreover, the protection film 21C may be formed by a high melting metal silicide (TiSix, TaSix, WSix) film or a high melting point metal film other than those mentioned above. This protection film 21C is formed as thin as 100 to 4000[Å].

In case the protection film 21C is formed by a high melting point metal silicide film such as MoSix, the aluminum particles diffuse from the aluminum film 21B depending on the content of silicon (Si) and thereby aluminum oxide ($Al_2O_3$) is precipitated on the surface of protection film 21C. Precipitation of aluminum oxide results in fault contact between the protection film 21C and upper layer wiring (23).

In the same column direction as the extending complementary data lines (DL) 21, the Y select signal line (YSL) 21 formed by the same conductive layer (the same triple layer structure) is also extended. As mentioned above, the first electrode layer 13 of the information accummulating capacitance element C of the stacked structure is guided up to the position laid under the Y select signal line 21.

he complementary data line 21 and Y select signal line 21 (wiring 21) are formed by the wiring forming process for the 1st layer in the manufacturing process. The complementary data line 21 and Y select signal line 21 formed in the wiring forming process for the 1st layer are formed thinner than the upper layer wiring (23) in order to alleviate the stepped region which is peculiar to the multilayer wiring structure.

As indicated in FIG. 2 and FIG. 3, a word line (WL) 23 for shunt is extended in the row direction through the interlayer insulation film 22 as the upper layer on the complementary data line 21 and Y select signal line 21. Although not illustrated, the word line 23 for shunt is once dropped and is connected to an intermediate conductive layer (not illustrated) through a connecting hole 22D which is similar to the hole indicated in the right side (peripheral circuit) of FIG. 3 in the corresponding specified region in every several tens to several hundreds of memory cells M. The intermediate conductive layer is formed by the wiring forming process for the 1st layer and is connected to the word line 7 through the connecting hole 19C. The word line 23 for shunt is formed to lower a resistance value of word line 7. Namely, the word line 23 for shunt is formed to improve selection speed of memory cell M. The intermediate conductive layer is provided to alleviate the stepped region for connecting the word line 23 for shunt and word line 7 and prevent disconnection of word line 23 for shunt.

The interlayer insulation film 22 described above is formed, as shown in FIG. 3, in the triple structure comprised of sequentially stacked silicon oxide film 22A deposited by the plasma CVD method, silicon oxide film 22B completed the baking process after the coating and silicon oxide film 22C deposited by the CVD method. The intermediate silicon oxide film 22B of the interlayer insulation film 22 is laid to make flat the surface of the silicon oxide film 22C as the upper layer.

The connecting hole 22D formed to the interlayer insulation film 22 has the large aperture diameter in the upper side and the smaller aperture diameter in the lower side to provide the staircase sectional view. This connecting hole 22D is formed to alleviate the stepped region for connecting the word line 23 for shunt and intermediate conductive layer and prevent disconnection of word line 23 for shunt.

The word line 23 for shunt explained previously as the double layer structure, as shown in FIG. 3, sequentially stacking a base film 23A and an aluminum film 23B.

The base film 23A is formed by $MoSi_2$, which can reduce migration of stress because Mo diffuses into the aluminum film 23B to suppress growth of crystal grains of aluminum film 23B. The base film 23A may also be formed by a high melting point silicide film or high melting point metal film other than those explained earlier.

The aluminum film 23B adds Si and Cu like the aluminum film 21B mentioned previously.

The word line 23 for shunt is formed by the wiring forming process for the 2nd layer in the manufacturing process.

The word line 23 for shunt formed by the wiring forming process for the 2nd layer is formed thicker than a lower layer wiring (21) formed by the wiring forming process for the 1st layer and reduces a resistance value.

The upper side of FIG. 2 and center region of FIG. 3 indicate the end part of memory cell array and this region is provided with a guard ring GL, which is surrounding the memory cell array to mainly capture minority carrier released from a substrate bias generating circuit not illustrated. This guard ring GL is formed by the semiconductor region 9 provided in the main surface of well region 2 within the region specified by the element separating insulation film 5 and channel stopper region 4A. The guard ring GL is connected with a wiring 21 formed in the wiring forming process for the 1st layer through the connecting hole 19C. This wiring 21 receives the power supply voltage ½ $V_{cc}$. Moreover, the wiring 21 is connected to the second electrode layer 15 through a connecting hole 19C and the power supply voltage 1 is applied to the second electrode layer 15.

As explained above, in a DRAM, a pair of complementary data lines (DL) 21 and a Y select signal line (YSL) 21 to select such pair of complementary data lines 21 are formed with the same conductive layer and are extended in the same column direction, this complementary data line 21 and Y select signal line 21 are arranged alternately in the row direction, this complementary data line 21 is connected with a memory cell M comprising $MISFETQ_s$ for memory cell selection and the information accummulating capacitance element C of the stacked structure connected in series to the one semiconductor region 9 of $MISFETQ_s$, and the first electrode layer 13 forming the information accummulating capacitance element C of the stacked structure is extended up to the position overlapping with the Y select signal line 21 adjacent to the complementary data line 21 connecting the memory cell M, thereby the area of first electrode layer 13 of the information accummulating capacitance element C of stacked structure can be increased by making use of the space for extending the Y select signal line 21 and accummulation amount of charge of information accummulating capacitance element C of stacked structure. This first electrode layer 13 of the information accummulating capacitance element C of stacked structure is not symmetrical to the complementary data line 21 and is formed asymmetrical and guided to the lower part of Y select signal line 21. Increase in accummulation amount of charge of information accummulating capacitance element C of stacked structure results in decrease of software error in the memory cell mode of DRAM. Moreover, noise margin of information readout signal of DRAM can be enlarged.

A CMOS which forms the peripheral circuits has the structure indicated in the right side of FIG. 3. The n-channel $MISFETQ_n$ of CMOS is formed on the main surface of well region 2 within the region surrounded by the element separating insulation film 5 and channel stopper region 4A. $MISFETQ_n$ is mainly formed by a well region 2, a gate insulation film 6, a gate electrode 7, a pair of n-type semiconductor regions 9 as the source region and drain region, and a pair of n+ type semiconductor regions 17.

The well region 2, gate insulation film 6, gate electrode 7 and semiconductor region 9 are respectively formed by the manufacturing process similar to that of $MISFETQ_s$ for memory cell selection and have the similar function. Namely, $MISFETQ_n$ is formed by the LDD structure.

The semiconductor region 17 with high impurity concentration reduces specific resistances of source region and drain region. The semiconductor region 17 is formed with specification by a side wall spacer 11 formed by self-alignment to the side wall of gate electrode 7 and is formed by self-alignment to the gate electrode 7.

The semiconductor region 17 used as the source region is connected with the wiring 21 to which the reference voltage $V_{ss}$ is applied through the connecting hole 19C. The semiconductor region 17 used as the drain region is connected with the wiring 21 for output signal through the connecting hole 19C. A semiconductor region 20 is provided to the main surface of the well region 2 at the connecting part of semiconductor region 17 and wiring 21 in order to prevent shortcircuit of the well region 2 and wiring 21. These wirings 21 are formed by the wiring forming process for the 1st layer.

The p-channel $MISFETQ_p$ of CMOS is formed on the main surface of well region 3 within the region surrounded by the element separating insulation film 5. The $MISFETQ_p$ is formed mainly by a well region 3, a gate insulation film 6, a gate electrode 7, a pair of p-type semiconductor region 10 as the source region and drain region and a pair of p+ type semiconductor regions 18.

The well region 3, gate insulation film 6 and gate electrode 7 respectively have substantially the same function as the $MISFETQ_s$, $Q_n$.

The p-type semiconductor region 10 of low impurity concentration is provided between the p+ type semiconductor region 18 and the channel forming region, forming $MISFETQ_p$ of LDD structure.

The semiconductor region 18 used as the source region is connected with the wiring 21 to which the power supply voltage $V_{cc}$ is applied through the connecting hole 19C. The semiconductor region 18 used as the drain region is connected with the wiring 21 for output signal integrally formed with the wiring 21 for output signal mentioned above through the connecting hole 19C. These wirings 21 are formed by the wiring forming process for the 1st layer.

The wiring 21 for output signal is connected with the wiring 23 for output signal formed by the wiring forming process for the 2nd layer through the connecting hole 22D.

Next, the practical manufacturing method of DRAM is briefly explained with reference to FIG. 4 to FIG. 23.

First, a $p^-$ type semiconductor substrate 1 made of single crystal silicon is prepared. The semiconductor substrate 1 has, for example, a resistance value of about 8~12[ohm-cm].

Next, a silicon oxide film 24 is formed on the main surface of the semiconductor substrate 1. The silicon oxide film 24 is formed by thermal oxidation in a steam atmosphere at a temperature as high as about 900~1000[° C.] in the thickness of about, for example, 400~500[Å].

Next, an oxidationproof film 25 is formed on the silicon oxide film 24. The oxidationproof film 25 is formed, for example, using a silicon nitride film deposited by the CVD method in the thickness of about 1200[Å].

Figure 5:
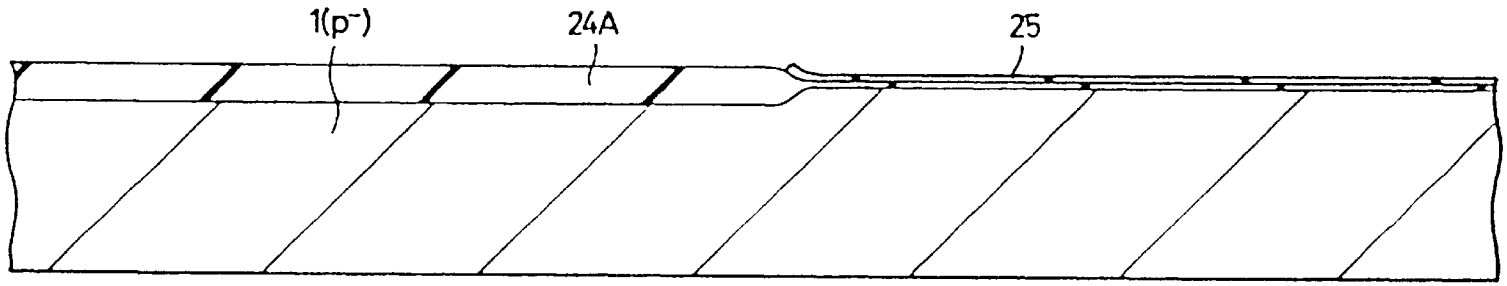
Figure 6:
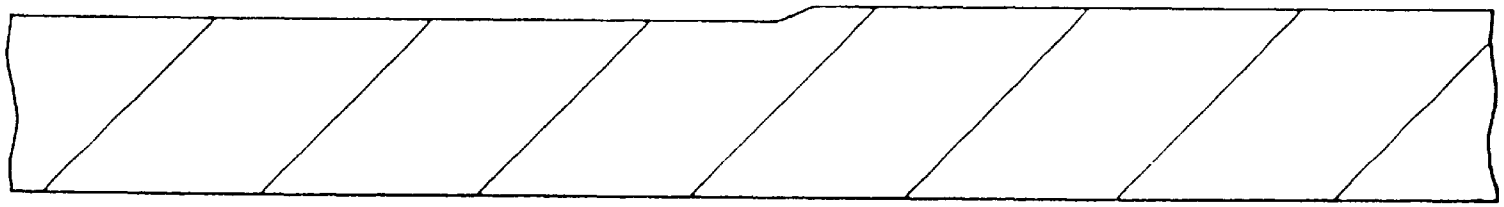

Next, the oxidationproof film 25 is selectively removed from the region to form memory cell of the semiconductor substrate 1. Thereafter, as shown in FIG. 5, an oxide film 24A is formed in the thickness of about 12000[Å] is formed by the dry oxidation at 950° C. to the aperture of oxidationproof film. Thereafter, the silicon nitride film 25 and oxide films 24 and 24A used as the oxidationproof mask 25 are removed by etching and as shown in FIG. 6, a semiconductor substrate having the recessed part of 6000[Å] can be formed. According to this method, since bird's beak is formed at the end part of oxidationproof mask 25, the smooth stepped portion can be formed after the oxide film 24A is removed. Since difference of average altitudes under the finished condition of the memory region and peripheral circuit region is about 1.2 $\mu$m, the depth of recessed part is set to 0.6 $\mu$m (6000 Å) which is equal to ½ of such altitude. This value may usually be set to about ½ of the difference between average altitudes of memory cell region and peripheral circuit region and it is certainly possible that the ideal values are different depending on respective semiconductor devices. The "average altitude" used here means the weighted average of altitude and occupied area of respective portions.

Next, the silicon oxide film 26 is formed on the main surface of semiconductor substrate 1. This silicon oxide film 26 is formed by the thermal oxidation in a steam atmosphere at a temperature as high as about 900~1000[° C.] in the thickness of about, for example, 400~500[Å].

Next, an oxidationproof film 27 is formed on the silicon oxide film 26. The oxidationproof film 27 is formed, for example, by the silicon nitride film deposited by the CVD method in the thickness, for example, of about 400~600 [Å].

Next, the oxidationproof film 27 in the n-type well region forming region is selectively removed and an impurity doping mask and oxidationproof mask are formed. Such selective removal of oxidationproof film 27 can be realized, for example, by the photolithography technology wherein the etching is carried out using a photoresist film.

Figure 7:
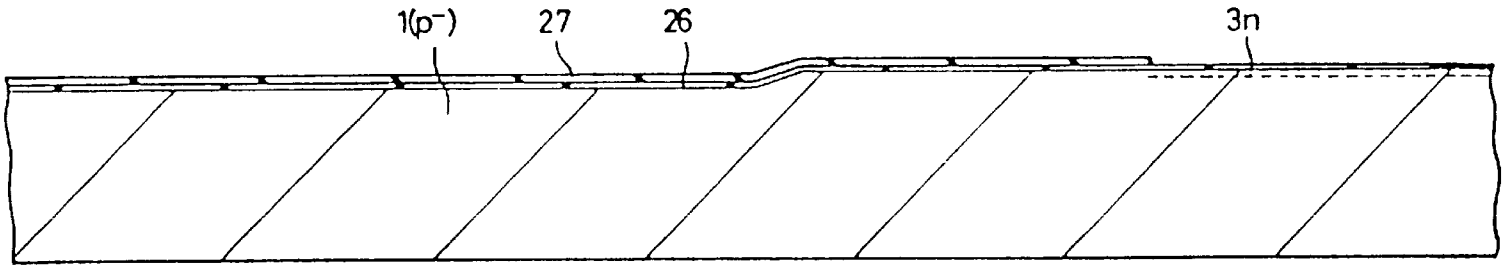

Next, as shown in FIG. 7, with the oxidationproof film 27 and a photoresist film (not illustrated) for patterning the film 27 used as the impurity doping mask, the n-type impurity 3n is selectively doped to the main surface of semiconductor substrate 1 through the silicon oxide film 25. In this case, the n-type impurity 3n is doped by the ion implantation method with an energy of about 120~130 [KeV] using phosphorus in the impurity concentration, for example, of $10^{13}$ [atoms/$cm^2$].

Figure 8:
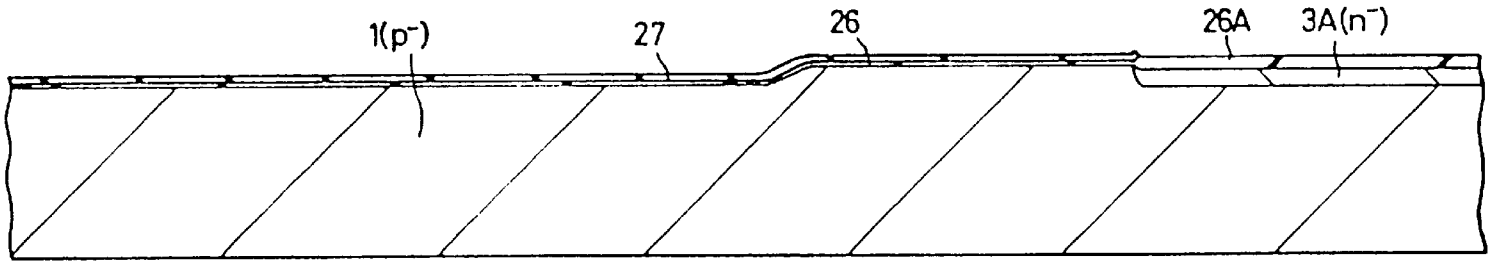

Thereafter, the photoresist film on the oxidationproof film 27 is removed. Then, as shown in FIG. 8, with the oxidationproof film 27 used as the oxidationproof mask, the exposed silicon oxide film 26 is caused to grow in order to form a silicon oxide film 26A. This silicon oxide film 26A is formed only in the n-type well region forming region. The silicon oxide film 26A is formed by the thermal oxidation in a steam atmosphere at a temperature as high as about 900~1000 [° C.] in the final thickness, for example, of about 1100~1200 [Å]. This silicon oxide film 26A is used as the impurity doping mask to form the p-type well region. The n-type impurity 3n doped previously is a little diffused by the oxidation process to form such silicon oxide film 26A and thereby the n-type semiconductor region (which becomes finally the well region) 3A is formed.

Figure 9:
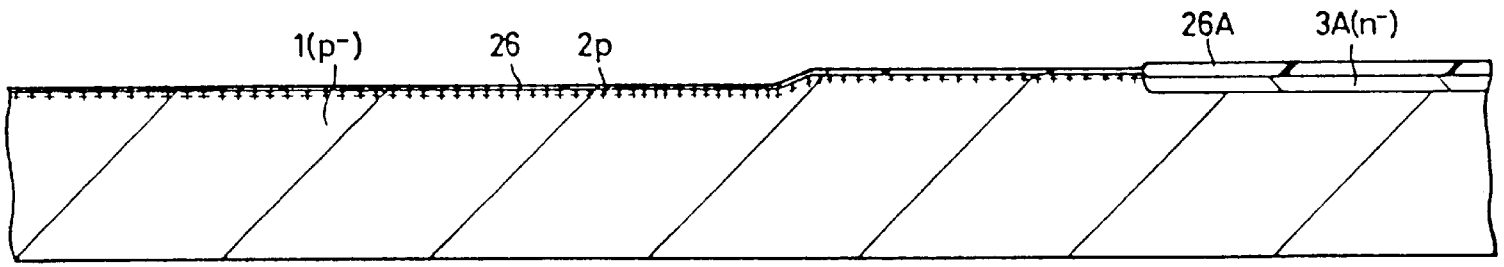

Next, the oxidationproof film 27 is selectively removed, for example, by hot phosphoric acid. Thereafter, as shown in FIG. 9, the silicon nitride film 26A is used as the impurity doping mask and the p-type impurity 2p is selectively doped to the main surface of semiconductor substrate 1 of the p-type well region forming region through the silicon oxide film 26. The p-type impurity 2p is doped by the ion implantation using $BF_2$ (or B) in the impurity concentration, for example, of about $10^{12}$~$10^{13}$[atoms/$cm^2$]. This p-type impurity 2p is not doped to the main surface of semiconductor region 3A which becomes the n-type well region because the silicon oxide film 26A is formed.

Figure 10:
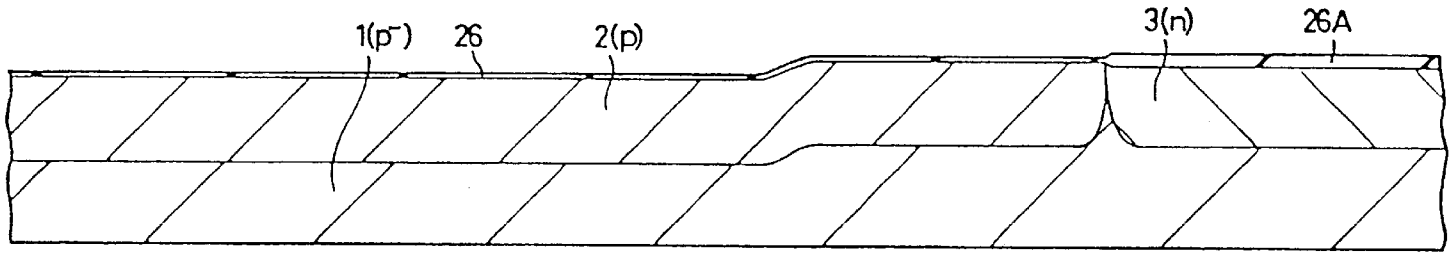

Next, as shown in FIG. 10, the n-type impurity 3n and p-type impurity 2p are respectively extensively diffused to form the n-type well region 3 and p-type well region 2 as shown in FIG. 10. These well regions 2 and 3 are formed by conducting heat processing in the ambience at the temperature as high as 1100~1300[° C.]. As a result, the p-type well region 2 is formed by the self-alignment for the n-type well region 3.

Next, an oxidationproof film 28 is formed to the entire part of substrate including the silicon oxide films 26, 26A. This oxidationproof film 28 is used as the impurity doping mask and oxidationproof mask and is formed in the thickness of about 400~1400[Å] using, for example, the silicon nitride film formed by the CVD method.

Next, The oxidationproof film 28 is coated with the photoresist film, the photoresist film of the element separating insulation film (5) forming region is removed and an etching mask and an impurity doping mask (not illustrated) are formed. The exposed oxidationproof film 28 is selectively removed using this mask.

Figure 11:
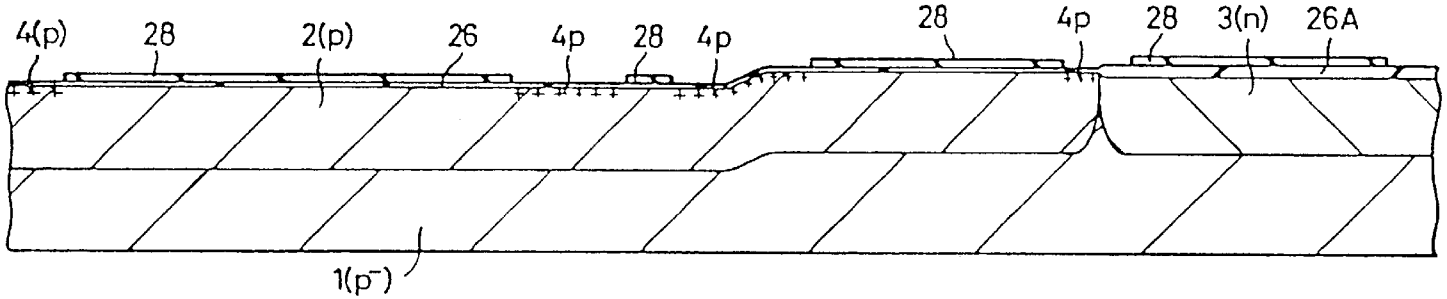

Next, with the oxidationproof film 28 and a mask consisting of the photoresist film obtained by patterning such oxidationproof film 28 used as the impurity doping masks, the p-type impurity 4p is doped to the main surface of well region 2 through the exposed silicon oxide film 26. The p-type impurity 4p is not doped to the main surface of well region 3 since the silicon oxide film 26A which is thicker than the silicon oxide film 26 is formed on the main surface of well region 3. Namely, the p-type impurity 4p is selectively doped into the main surface of well region 2 for forming: the channel stopper region and potential barrier layer. This p-type impurity 4p is doped by the ion implantation using $BF_2$ or B in the impurity concentration of about $10^{13}$ [atoms/cm2]. After doping of this p-type impurity 4p, as shown in FIG. 11, the photoresist film on the oxidationproof film 28 is removed.

Next, with the oxidationproof film 28 used as the mask, the exposed silicon oxide films 26, 26A are respectively caused to grow in order to form the element separating insulation film (field insulation film) 5. This element separating insulation film 5 can be formed by conducting the heat processing for about 110~130 [min] in the nitrogen gas ambience at the temperature, for example, as high as about 1000 [° C.] and then conducting steam thermal oxidation in a steam atmosphere for about 150~160 [min], or only by the steam oxidation.

With the substantially same manufacturing process as that to form such element separating insulation film 5, the p-type impurity 4p doped to the main surface of well region 2 is extensively diffused to form the p-type channel stopper region 4A. Since the comparatively long heat processing is carried out on the occasion of forming the channel stopper region 4A, lateral diffusion is remarkable and particularly the p-type impurity 4p is diffused to almost the entire part of memory cell M forming region in the memory cell array and thereby the p-type potential barrier layer 4B is formed.

In the case of a large capacity DRAM, since the gate width (channel width), size of $MISFETQ_s$ for memory cell selection of memory cell M and the size of semiconductor region 9 in such direction is about 1.0 [$\mu$m], the p-type impurity 4p forming the channel stopper region 4A diffuses up to almost the entire surface of the memory cell M forming region and the potential barrier layer 4B is formed to almost the entire part of memory cell M forming region as explained previously.

In the n-channel $MISFETQ_n$ forming region forming CMOS of peripheral circuit, since the $MISFETQ_n$ is larger in size than the memory cell M size, the p-type impurity 4p is diffused only to a part in the neighborhood of the element separating insulation film 5 and the potential barrier layer 4B is not substantially formed. Namely, the potential barrier layer 4B is not formed in the $MISFETQ_n$ forming region of peripheral circuit and is formed selectively in the memory cell array forming region. Moreover, the potential barrier layer 4B is formed by the similar manufacturing process to that of channel stopper region 4A.

Figure 12:
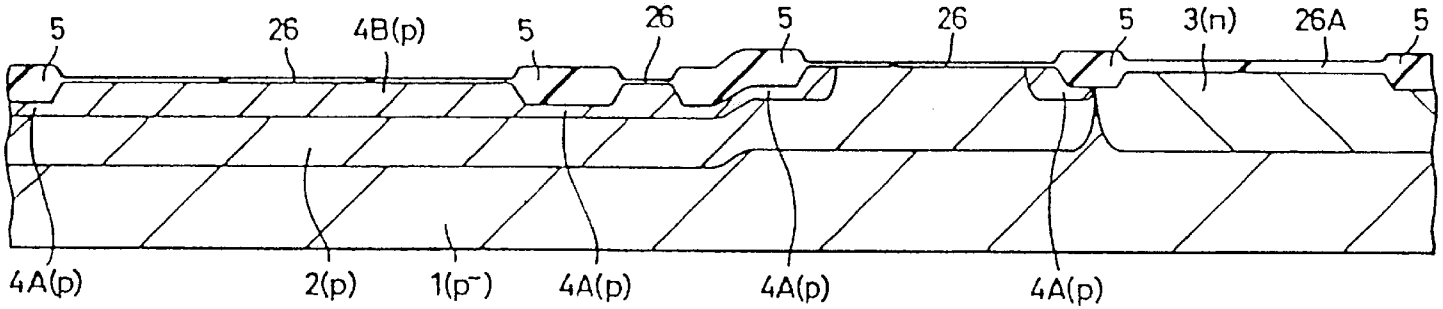

The channel stopper region 4A and potential barrier layer 4B are respectively formed, after the heat processing, in the impurity concentration of about $10^{16}$~$10^{17}$ [atoms/cm$^3$]. After formation of the channel stopper region 4A and potential barrier layer 4B, the oxidationproof film 28 is selectively removed as shown in FIG. 12.

In the DRAM wherein the memory cell M is surrounded by the element separating insulation film 5 and channel stopper region 4A, the p-type impurity 4p of the same conductivity type as that of well region 2 and in high concentration is doped to the main surface between $MISFETQ_s$ of memory cell M of well region 2, the p-type impurity 4p is diffused in the main surface of well region 2 up to at least the region under the one semiconductor region (connecting side with the information accummulating capacitance element C) 9 forming region of the $MISFETQ_s$ to form the channel stopper region 4A and potential barrier layer 4B, and the process to form the potential barrier layer 4B can also be replaced with the process to form the channel stopper region 4A. Therefore, the manufacturing process of DRAM can be reduced. Namely, the mask forming process and impurity doping process to form the potential barrier layer 4B can be reduced.

In addition, the potential barrier layer 4B can be formed, on the self-alignment basis, respectively for the element separating insulation film 5 and channel stopper region 4A. Therefore, the masking allowance in the manufacturing process can be eliminated, realizing reduction in area of memory cell M of DRAM resulting in improvement of integration density.

Moreover, the potential barrier lay 4B sufficiently diffuses the p-type impurity doped to form the channel stopper region 4A by the heat processing and therefore damage resulting from impurity doping of well region 2 can be recovered and crystal defect can be lowered. Reduction of crystal defect improves refresh characteristic of DRAM.

Here, the memory cell array is not always restricted to provide the well region 2 in case the potential barrier layer 4B is formed to the entire part of memory cell M forming region.

After the process to eliminate the oxidationproof film 28 indicated in FIG. 12, the silicon oxide film 26 on the main surface of well region 2 and the silicon oxide film 26A on the main surface of well region 3 are removed to disclose the main surfaces of well regions 2, 3 respectively.

A silicon oxide film 6A is then formed respectively on the main surfaces of exposed well regions 2, 3. This silicon oxide film 6A is formed to oxidize a silicon nitride film, so-called a white ribbon which is formed at the end portion of the element separating insulation film 5 by the oxidation-proof film (silicon nitride film) 28 during formation of the element separating insulation film 5. The silicon oxide film 6A is formed by the thermal oxidation in a steam atmosphere at a temperature as high as about 900~1000[° C.] in the thickness of about 400~1000[Å].

Next, the n-type impurity 29p for adjusting the threshold value of n-channel MISFET is doped to the main surfaces of well regions 2 (potential barrier layer 4B in the memory cell array), 3 which are element forming regions specified by the element separating insulation film 5, namely to the entire part of substrate. The p-type impurity 29p is doped by the ion implantation with an energy of about 30 [KeV] using boron with impurity concentration of about $10^{11}$ [atoms/cm$^2$].

Figure 13:
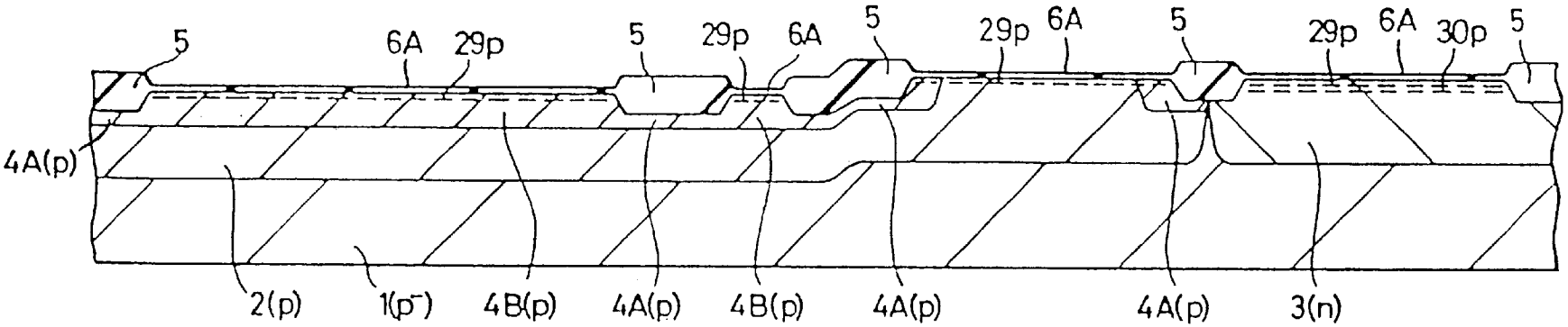

Next, as shown in FIG. 13, the p-type impurity 30p for adjusting threshold value of p-channel MISFET is doped selectively to the main surface of well region 3 which is the element forming region specified by the element separating insulation film 5. This p-type impurity 30 is doped by the ion implantation with an energy of about 30 [KeV] using boron with impurity concentration of about $10^{12}$ [atoms/cm$^2$]. Doping of the p-type impurities for adjusting threshold values can be omitted in accordance with a method of setting impurity concentration in the well regions 2, 3.

Next, the silicon oxide film 6A is selectively removed to disclose the main surfaces of respective well regions 2, 3. The silicon oxide film 6A can be removed by wet etching.

Next, a gate insulation film 6 is formed on the main surfaces of exposed well regions 2, 3. The gate insulation film 6 is formed by the thermal oxidation in a steam atmosphere at a temperature as high as 800~1000[° C.] in the thickness of about 150~250[Å].

Thereafter, a polycrystal silicon film is formed to the entire part of substrate including the areas on the gate insulation film 6 and element separating insulation film 5. This polycrystal silicon film is deposited by the CVD method in the thickness of about 2000~3000 [Å] and is formed by the gate wiring forming process for the 1st layer in the manufacturing process. Thereafter, phosphorus P is diffused by the thermal diffusion to the polycrystal silicon film in order to reduce a resistance value thereof.

Next, an interlayer insulation film 8 is formed to the entire part of polycrystal silicon film mainly for electrically separating the polycrystal silicon film and a conductive layer formed thereon. This interlayer insulation film 8 is formed, for example, using the silicon oxide film deposited by the CVD method, in the thickness of about 3500~4500 [Å].

Figure 14:
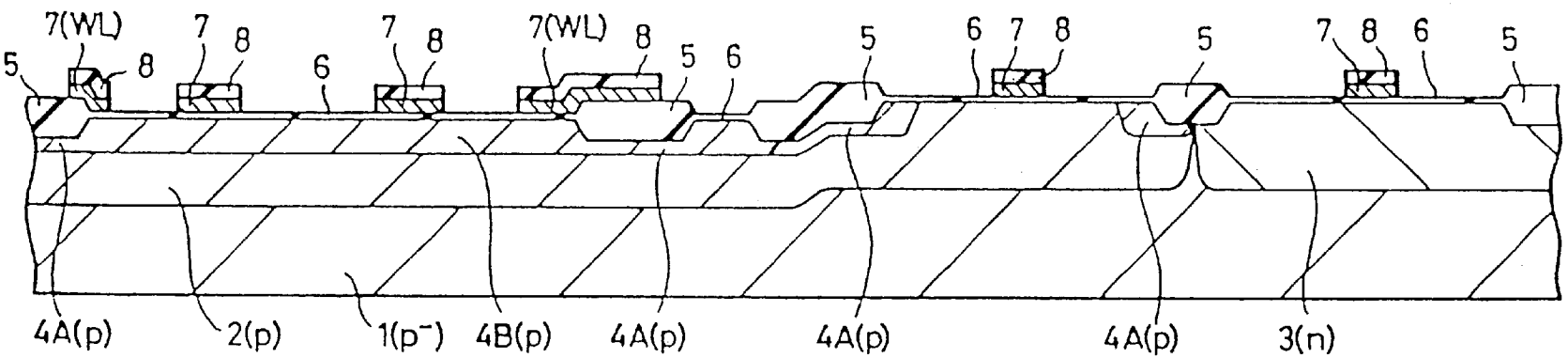

As indicated in FIG. 14, with the etching mask formed by the photoresist film not illustrated, the gate insulation film 7 and word line (WL) 7 are formed by sequentially etching the interlayer insulation film 8 and polycrystal silicon film. Since the interlayer insulation film 8 and polycrystal silicon film are cut while these are laid, the interlayer insulation film 8 is left in the same shape on the gate electrode 7 and word line 7. In the gate wiring forming process for the 1st layer, the gate electrode 7 and word line 7 of MISFETQ$_s$ in the memory cell array are formed and the gate electrode 7 of MISFETQ$_n$, Q$_s$ of the peripheral circuit is formed. Moreover, in the gate wiring forming process for the 1st layer, the interelement connecting wirings and resistance elements, although not illustrated, are formed. As the etching, the anisotropic etching such as RIE, etc. is used. Thereafter, the photoresist film is removed.

Next, a silicon oxide film (not illustrated) is formed respectively on the main surfaces (including the side walls of gate electrode 7 and word line 7) of the exposed well regions 2, 3 in order to lower contamination resulting from impurity doping. The silicon oxide film is formed, for example, in the oxygen gas ambience at a temperature as high as about 850~950[° C.] in the thickness of about 100~800 [Å].

Thereafter, with the element separating insulation film 5 and interlayer insulation film 8 used as the impurity doping masks, the n-type impurity is doped selectively to the main surface of the well region 2 of the memory cell array forming region and n-channel MISFETQ$_n$ forming region. By the doping of this n-channel impurity, the n-type semiconductor region 9 with low impurity concentration is formed on the self-alignment basis for the gate electrode 7 and word line 7. The n-type impurity to form the semiconductor region 9 can be doped by the ion implantation with an energy of about 60~120 [KeV] using phosphorus P (or Arsenic As) with concentration of about $10^{13}$ [atoms/cm$^2$]. As is already explained, the semiconductor region 9 at least in the side connected to the information accummulating capacitance element C of MISFETQ$_s$ for memory selection of memory cell M is formed by the ion implantation with impurity concentration as low as under $10^{14}$ [atoms/cm$^2$]. Since the semiconductor region 9 is formed with low impurity concentration, MISFETQ$_s$, Q$_n$ can respectively be formed in the LDD structure. On the occasion of forming the semiconductor region 9, the p-channel MISFETQ$_p$ forming region is covered with the impurity doping mask formed by the photoresist film. Although explained later, the MISFETQ$_n$ which forms CMOS of the peripheral circuit constitutes the source region and drain region with the semiconductor region 9 and semiconductor region 17 formed by the ion implantation with impurity concentration as high as $10^{14}$ [atoms/cm$^2$] or more. In the process to form the semiconductor region 9, the MISFETQ$_2$ for memory cell selection of memory cell M is almost completed.

In the DRAM wherein the memory cell M is formed by the information accummulating capacitance element C of stacked structure, the one semiconductor region 9 of MISFETQ$_s$ of memory cell M is formed by the ion implantation of impurity concentration lower than that for the semiconductor region 17 of high impurity concentration of MISFETQ$_n$ of peripheral circuit other than the memory cell M. Thereby, generation of crystal defect at the surface of well region 2 based on the ion implantation to form the source region or drain region can be lowered and leak of charges which become the information accummulated to the information accummulating capacitance element C can also be lowered, thus improving the refresh characteristic of DRAM. Improvement in the refresh characteristic assures operation rates of information writing operation and information readout operation of DRAM.

In addition, since MISFETQ$_s$ of memory cell M is formed in the channel forming region side by the semiconductor region 9 with low impurity concentration, the short channel effect can be suppressed and area of memory cell M can also be reduced. Namely, the semiconductor region 9 can improve integration density of DRAM.

Moreover, the semiconductor region 9 of MISFETQ$_s$ of memory cell M can also be formed in common by the process to form the semiconductor region 9 of MISFETQ$_n$ without adding the ion implantation process with low impurity concentration for MISFETQ$_s$ by forming this region with the same manufacturing process for the semiconductor region 9 to form the LDD structure of MISFETQ$_n$ of CMOS of peripheral circuit and accordingly the manufacturing process of DRAM can be reduced.

Particularly in the memory cell M forming region, since the potential barrier layer 4B is formed by diffusion of the p-type impurity 4p of channel stopper region 4A and impurity concentration of both regions can be set in the range as low as about $10^{16}$~$10^{17}$ [atoms/cm$^3$]. Accordingly, the voltage resistance of pn junction between the semiconductor region 9 of MISFETQ$_s$ and potential barrier layer 4B or channel stopper region 4A can be improved. That is, in the DRAM wherein the memory cell M is surrounded by the element separating insulation film 5 and channel stopper region 4A, since the potential barrier layer 4B can suppress capture of minority carrier by information accummulating capacitance element C by providing such potential barrier layer 4B formed by diffusing p-type impurity 4p of channel stopper region 4A to the main surface of well region 2 under the at least one semiconductor region (side connected to the information accummulating capacitance element C) of MISFETQ$_s$ of the memory cell M, soft error of memory mode can be prevented and voltage resistance of pn junction between the channel stopper region 4A or potential barrier layer 4B and the one semiconductor region 9 described above can be improved by substantially equalizing the impurity concentration of both channel stopper region 4A and potential barrier layer 4B. Thereby, leak of charges which become the information of information accummulating capacitance element C can be reduced and information holding characteristic can also be improved. Such improvement of information holding characteristic improves refresh characteristic of DRAM and realizes improvement of operation rates of information writing operation and information readout operation.

The information holding characteristic can further be improved because the soft error of data line mode can be prevented in addition to the effect mentioned above by providing, in the DRAM, the potential barrier layer 4B to the main surfaces of well regions 2 under the one semiconductor region 9 and the other semiconductor region (side connected to the complementary data line 21) 9 of MISFETQ$_s$ of memory cell M.

Figure 15:
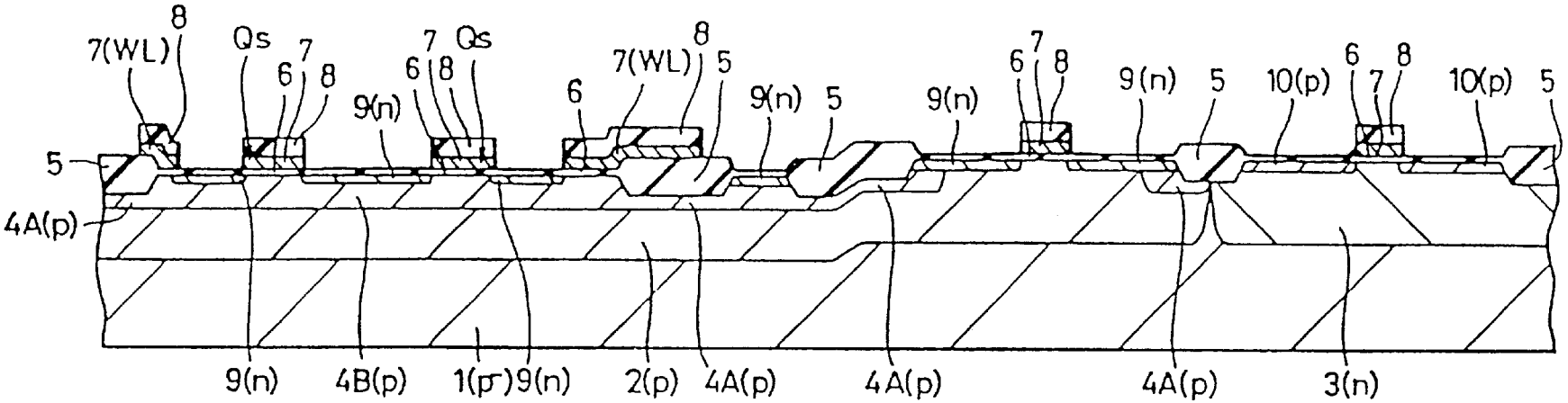

Next, after the process to form the semiconductor region 9, with the element separating insulation film 5 and interlayer insulation film 8 used as the impurity doping masks, the p-type impurity is doped selectively to the main surface of well region 3 of the p-channel MISFETQ$_p$ forming region. With doping of the p type impurity, a p-type semiconductor region 10 of low impurity concentration is formed to the gate electrode 7 on the self-alignment basis, as indicated in FIG. 15. The p-type impurity is doped by the ion implantation with an energy of about 60~100 [KeV] using BF$_2$ (or B) with concentration of about $10^{13}$ [atoms/cm$^2$]. When the semiconductor region 10 is to be formed, the memory cell array forming region and n-channel MIS- $FETQ_n$ forming region are covered with impurity doping mask formed by the photoresist film.

Figure 16:
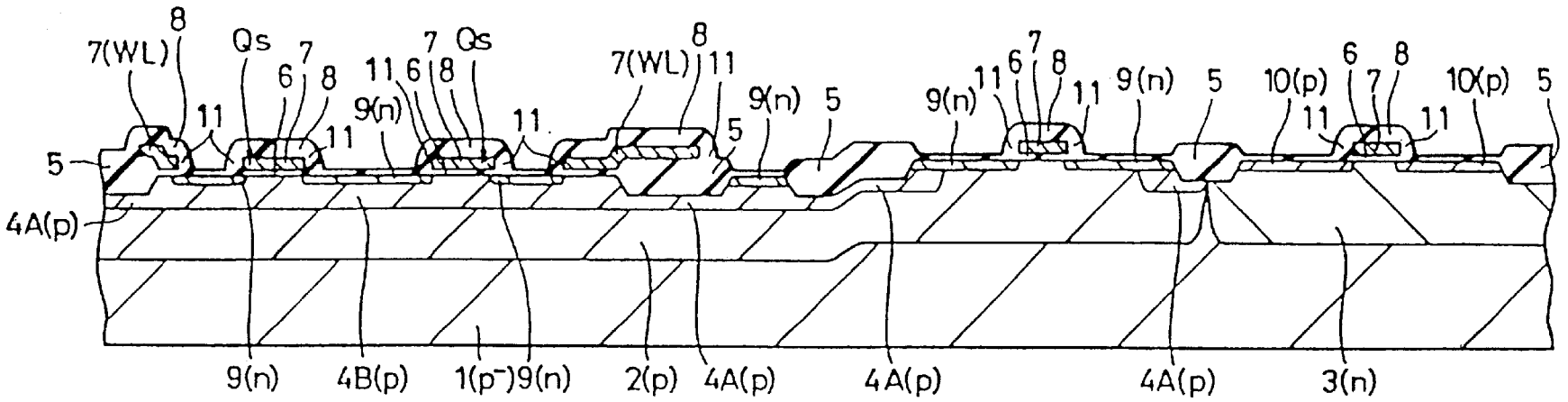

Next, as shown in FIG. 16, the side wall spacer 11 is formed to respective side walls of gate electrode 7 and word line 7. The side wall spacer 11 can be formed by conducting the anisotropic etching such as RIE to the silicon oxide film deposited by the CVD. The silicon oxide film is formed in the thickness, for example, about 3500~4500 [Å]. The length of side wall spacer 11 in the gate length direction is about 2500~4000 [Å]. In this case, the region may be formed by etching under restriction by the photoresist film as required.

Next, an interlayer insulation film 12 is formed on the entire part of substrate including the side wall spacer 11 on the interlayer insulation film 8. This interlayer insulation film 12 is used as the etching stopper for patterning the first electrode layer (13) and second electrode layer (15) forming the information accummulating capacitance element C of stacked structure. Therefore, the interlayer insulation film 12 is formed in such thickness as considering the amount of the first and second electrode layers to be removed by the overetching during the etching process and the amount of the second electrode layer in the washing process until it is formed. Particularly when the first electrode layer and second electrode layer are patterned, the interlayer insulation film 12 is formed to protect the surface of the other semiconductor region (side wherein the complementary data line 21 is connected) 9 of $MISFETQ_s$ for memory cell selection from damage by the etching. This interlayer insulation film 12 is formed in the thickness of about 1000~2000 [Å] under a temperature, for example, as high as about 700~800 [° C.] using the silicon oxide film deposited by the CVD method.

Figure 17:
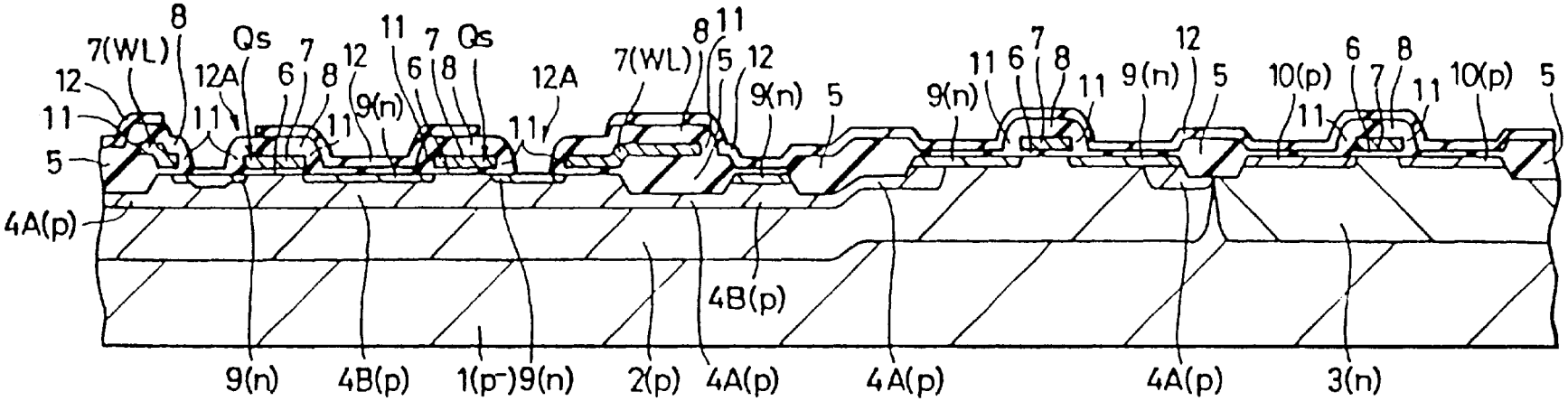

Next, as shown in FIG. 17, the interlayer insulation film 12 on the one semiconductor region (side wherein the first electrode layer 13 of information accummulating capacitance element C is connected) of $MISFETQ_s$ of the memory cell M forming region is removed selectively to form a connecting hole 12A. The connecting hole 12A is formed larger in size at least by such a degree as corresponding to the allowance of masking in the manufacturing process, in the column direction, than the size specified by the side wall spacer 11 at the side wall of the gate electrode 7 and the side wall spacer 11 at the side wall of word line 7 adjacent to such gate electrode 7 of $MISFETQ_s$. Namely, the connecting hole 12A is specified substantially in the size of semiconductor region 9 to be exposed by the side wall spacer 11.

Figure 18:
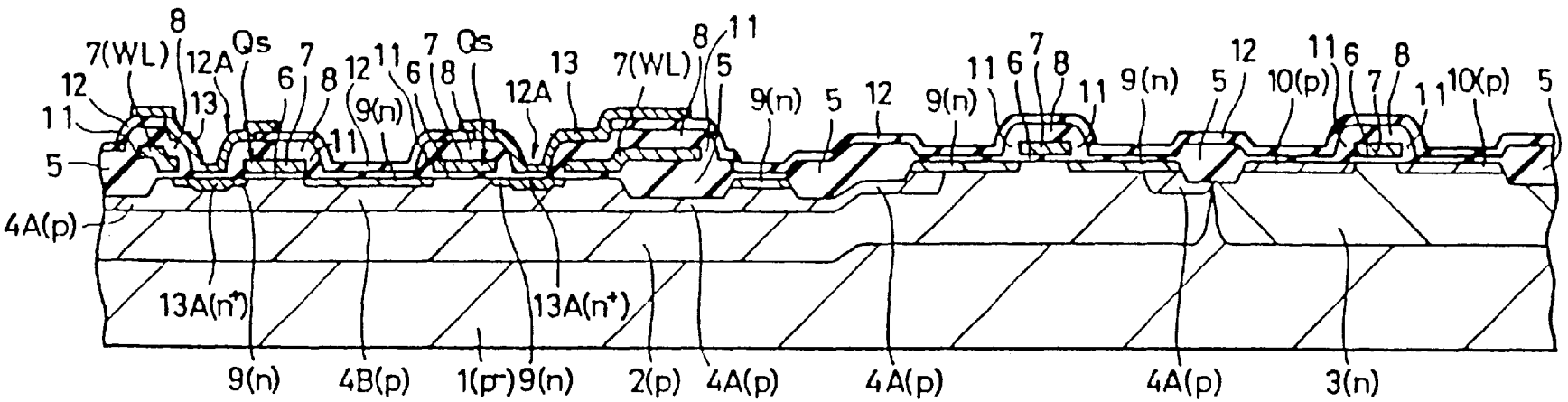

Next, as indicated in FIG. 18, a first electrode layer 13, the one end thereof is connected to the semiconductor region 9 through the connecting hole 12A and the other end is extending over the gate electrode 7 and word line 7 through the interlayer insulation films 8 and 12, is formed. This first electrode layer 13 forms the electrode layer under the information accummulating capacitance element C of stacked structure. This first electrode layer 13 is formed larger at least by the amount corresponding to allowance for masking in the manufacturing process than the size of connecting hole 12A formed to the interlayer insulation film 12. If the first electrode layer 13 is formed smaller than such value in comparison with the size of connecting hole 12A, the end portion of first electrode layer 13 drops into the connecting hole 12A, generating an unwanted groove between the internal wall of connecting hole 12A and side wall at the end part first electrode layer 13. The region forming such groove is formed thicker than the other region when it is coated with the photoresist film for the patterning of the first electrode layer 13 and generates halation during development of photoresist film, resulting in the fault in the shape of the first electrode layer 13.

The first electrode layer 13 explained above is formed by polycrystal silicon deposited by the CVD method in the thickness of about 800~3000 [Å]. The polycrystal silicon film is formed, first, by forming a silicon oxide film on the surface, doping the n-type impurity through such silicon oxide film in order to reduce a value of resistance and then removing, after the heat processing, the silicon oxide film mentioned above. This silicon oxide film is formed by the thermal oxidation in a steam atmosphere to the surface of polycrystal silicon film in the thickness of about 100 [Å]. The n-type impurity is doped by the ion implantation method with an energy of about 75~85 [KeV] using arsenic As or phosphorus P with impurity concentration of about $10^{15}$ [atoms/$cm^2$]. The patterning of polycrystal silicon film is conducted by the dry etching. For the etching of polycrystal silicon film, the interlayer insulation film 12 is used as the etching stopper layer. This first electrode layer 13 is formed by the gate wiring forming process for the 2nd layer.

The n-type impurity doped to the first electrode layer (polycrystal silicon film) 13 by the heat processing after doping of the n-type impurity is diffused to the main surface of the well region 2 (in actual, the semiconductor region 9) to which the first electrode layer 13 and the one semiconductor region 9 are connected. With such diffusion, an n+ type semiconductor region 13A of high impurity concentration is formed in integration with the semiconductor region 9. The semiconductor region 13A forms the one semiconductor region of $MISFETQ_s$ for memory cell selection but mainly improves the ohmic characteristic of the semiconductor region 9 and the first electrode layer 13 (reduction of contact resistance value).

The first electrode layer 13 in the connecting hole 12A is electrically separated from the gate electrode 7 and word line 7 through the interlayer insulation film 8 and side wall spacer 11.

Figure 19:
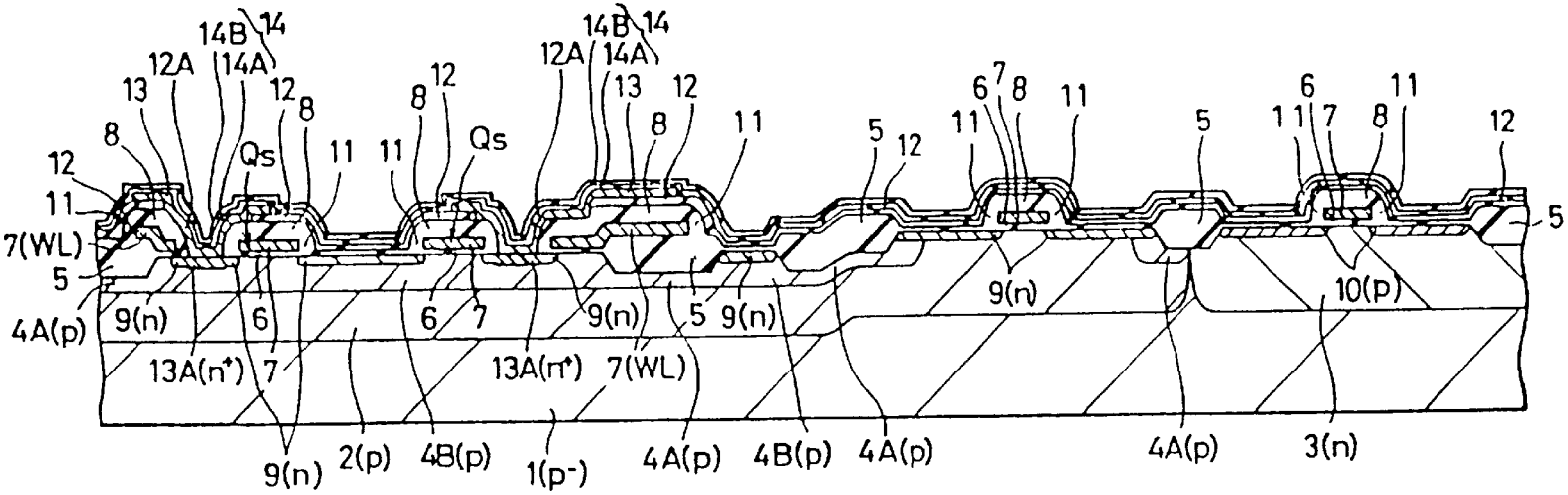

Next, as shown in FIG. 19, a dielectric material film 14 is formed to the entire part of substrate including the first electrode layer 13. As explained previously, this dielectric material film 14 is formed basically in the double layer structure wherein the silicon nitride film 14A and silicon oxide film 14B are sequentially stacked.

The silicon nitride film 14A is deposited by the CVD method on the first electrode layer (polycrystal silicon film) 13 in the thickness of about 50~100 [Å]. On the occasion of forming this silicon nitride film 14A, inclusion of oxygen is suppressed as much as possible. In case the silicon nitride film 14A is formed on the polycrystal silicon film under the ordinary production level, inclusion of a very small amount of oxygen is generated and thereby natural silicon oxide film (not illustrated) is formed between the first electrode layer 13 and silicon nitride film 14A. Accordingly, the dielectric material film 14 is formed in the triple layer structure wherein the natural silicon oxide film, silicon nitride film 14A and silicon oxide film 14B are sequentially stacked. The natural silicon oxide film can be formed thin by reducing inclusion of oxygen. Moreover, it is also possible, although the manufacturing processes increase, that the dielectric material film 14 is formed in the double layer structure by nitriding the natural silicon oxide film.

The silicon oxide film 14B is formed in the thickness of about 10~60 [Å] by oxidizing the silicon nitride film 14A of the lower layer under high pressure ambience. When the silicon oxide film 14B is formed, the silicon nitride film 14A is a little eaten and it is finally formed in the thickness of about 40~80 [Å]. The silicon oxide film 14B is basically formed in the oxygen gas ambience under the pressure as high as 1.5~10 [Toll] and the temperature as high as about 800~1000 [° C.]. In the case of this embodiment, the silicon oxide film 14B is formed under the pressure as high as 3~3.8 [Toll] with oxygen flow rate (source gas) of 2 [l/min] and hydrogen flow rate (source gas) of 3~8 [l/min] used for the oxidation. The silicon oxide film 14B formed by high pressure oxidation can be formed in the specified thickness within a short period in comparison with the silicon oxide film formed under the normal pressure (1 [toll]). The high pressure oxidation curtails the heat processing period at a high temperature and also realizes formation of high quality dielectric material film. Since curtailment of the oxidation period makes shallow the depth of pn junction of source region and drain region of MISFETQ$_s$, Q$_n$ and Q$_p$ and thereby MISFET can be further micro-miniaturized.

In the DRAM having the information accummulating capacitance element C of stacked structure, the first electrode layer 13 of the information accummulating capacitance element C is formed by the polycrystal silicon film wherein an impurity is doped to reduce a resistance value and the dielectric material film 14 is formed by the silicon nitride film 14A deposited on the first electrode layer 13 and the silicon oxide film 14B formed on the silicon nitride film 14A by executing the high pressure oxidation to the surface thereof. Thereby, the silicon nitride film 14A can be formed in the uniform thickness without influence of crystal condition and shape at the surface of the first electrode layer 13 as the base layer and a high quality silicon nitride film 14B can be formed in this silicon nitride film 14A. Accordingly, improvement of dielectric strength of dielectric material film 14, reduction in number of defects per unit area of dielectric material film 14 and reduction of leak current of dielectric material film 14 can be realized and the period to form the silicon oxide film 14B can be curtailed, thereby realizing further miniaturization of elements and improvement in packing density.

The dielectric material film 14 of the information accummulating capacitance element C of stacked structure may also be formed in the quadruple layer structure wherein the natural silicon oxide film, silicon nitride film 14A, silicon oxide film 14B and silicon nitride film as the upper layer are sequentially stacked. The dielectric material film 14 of triple layer structure explained above has a low initial dielectric strength, in case the electrode layer (15) as the upper layer is negative, since a current flows more than that in the case where the electrode layer is positive. The dielectric material film 14 of the quadruple layer structure provides the silicon nitride film between the silicon oxide film 14B and electrode layer (15) as the upper layer and thereby can improve the initial dielectric strength.

Next, a polycrystal silicon film which forms a second electrode layer (15) is formed to the entire part of the dielectric material film 14. The polycrystal silicon film is deposited by the CVD method in the thickness of about 1500~2500 [Å] in the gate wiring forming process for the 3rd layer in the manufacturing process.

Next the n-type impurity is doped to the polycrystal silicon film in order to reduce a resistance value. This is doped to the polycrystal silicon film by the hot diffusion using phosphorus, so that a specific resistance value of polycrystal silicon film becomes about 20~100 [ohms/square].

Thereafter, the entire part of polycrystal silicon film is coated with a photoresist film. Next, the etching mask 31 (indicated by a dotted line) is formed leaving the photoresist film on the second electrode layer (15) forming region of the information accummulating capacitance element C of memory cell M by the photolithography technology.

Figure 20:
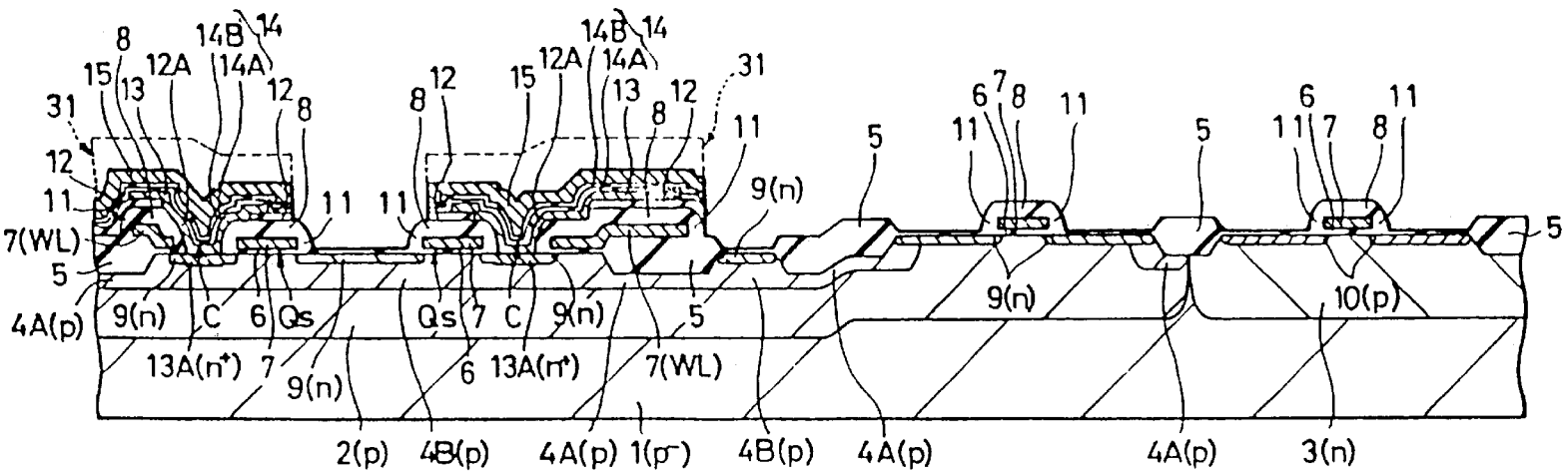

With this etching mask 31 used, the polycrystal silicon film is etched to form the second electrode layer 15. For this etching, the plasma etching is used. Thereafter, as shown in FIG. 20, the exposed dielectric material film 14 and the interlayer insulation film 12 as the under layer are sequentially etched using the etching mask 31 (the second electrode layer 15 may also be used). For this etching, the dry etching method is employed. The dielectric material film 14 is formed substantially in the same shape as the second electrode layer 15 only under thereof. The dielectric material film 14 and interlayer insulation film 12 on the other semiconductor region (side wherein the complementary data line 21 is connected) of MISFETQ$_s$ of memory cell M and the MISFETQ$_n$, Q$_p$ of peripheral circuit can be removed by the etching explained previously.

With the process to form the second electrode layer 15, the information accummulating capacitance element C of the stacked structure of memory cell M is almost completed. Thereby, the memory cell M is also almost completed simultaneously.

In the DRAM forming the memory cell M with the information accummulating capacitance element C of stacked structure, the dielectric material film 14 is covered with the second electrode layer 15 and the charges accummulated (charge-up) in the dielectric material film 14 can be reduced in the process to pattern the second electrode layer 15 or the successive processes by forming the information accummulating capacitance element C of the stacked structure by the first electrode layer 13 connected to the one semiconductor region 9 of MISFETQ$_s$, the second electrode layer 15 provided on the first electrode layer 13 in such a manner as covering it and the dielectric material film 14 which is substantially the same in the shape as the second electrode layer 15 provided between the first electrode layer 13 and the second electrode layer 15. Thereby, deterioration of dielectric strength (characteristic) of the dielectric material film 14 resulting from accummulation of charges can be prevented, assuring improvement of electric reliability of DRAM.

Meanwhile in the DRAM wherein the memory cell M is formed by the information accummulating capacitance element C of the stacked structure, a MISFETQ$_s$ for memory cell selection is formed, an interlayer insulation film 12 is formed covering such MISFETQ$_s$, this interlayer insulation film 12 is selectively removed on the one semiconductor region 9 of MISFETQ$_s$, a connecting hole 12A is formed exposing the one semiconductor region 9, the first electrode layer 13 of the information accummulating capacitance element C of stacked structure which is connected to such one semiconductor region 9 through the connecting hole 12 and is extending on the gate electrode 7 of MISFETQ$_s$ through the insulation film 12 is formed, the dielectric material layer 14 is formed on the first electrode layer 13 and the second electrode layer 15 is formed on the first electrode layer 13 covering it through the dielectric material film 14 and at least the interlayer insulation film 12 on the other semiconductor region 90 of MISFETQ$_s$ is removed using the second electrode layer 15 or the mask 31 to pattern it. Thereby, since the second electrode layer 12 or mask 31 can be used in common as the mask to remove the interlayer insulation film 12 on the other semiconductor region 9 in the side connected to the complementary data line (21) of MISFET, the mask forming process for removing the interlayer insulation film 12 can be reduced.

In addition, removal of interlayer insulation film 12 on the other semiconductor region 9 of MISFETQ$_s$ can be realized on the basis of self-alignment for the second electrode layer 12 by using the same mask. Accordingly, the memory cell M area can be reduced as much as the allowance for the masking in the manufacturing process. As a result, integration density of DRAM can be improved.

Next, an insulation film 16 is formed on the entire part of substrate. This insulation film 16 is formed on the semiconductor regions 9 and 10 which are at least the CMOS forming region of peripheral circuit and on the source region and drain region. This insulation film is also formed by the silicon oxide film deposited by the CVD method in the thickness of about 300 [Å].

Next, the n-type impurity is doped to the main surface of well region 2 in the n-channel MISFETQ$_n$ forming region which forms the CMOS of peripheral circuit. Doping of n-type impurity is conducted mainly using the gate electrode 7 and interlayer insulation film 8 as the impurity doping mask under the condition that the memory cell M forming region and p-channel MISFETQ$_p$ forming region are covered with the photoresist film. The n-type impurity is doped by the ion implantation with an energy of about 70~90 [KeV] using, for example, As in impurity concentration of about $10^{15}$ [atoms/cm$^2$].

Next, the p-type impurity is selectively doped to the main surface of well region 3 in the p-channel.

MISFETQ$_p$ forming region which forms CMOS of peripheral circuit. Doping of p-type impurity is conducted mainly using the gate electrode 7 and interlayer insulation film 8 as the impurity doping mask under the condition that the memory cell M forming region and n-channel MISFETQ$_n$ forming region are covered with photoresist film. This p-type impurity is doped by the ion implantation with an energy of about 70~90 [KeV] using, for example, $BF_2$ in impurity concentration about $10^{15}$ [atoms/cm$^2$].

Figure 21:
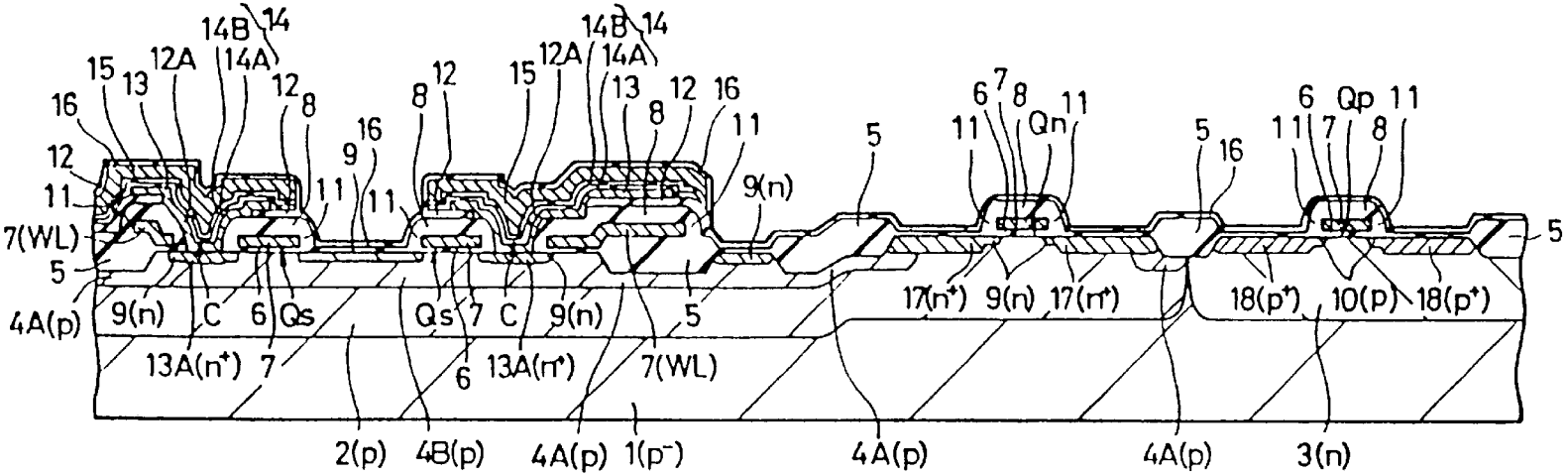

Thereafter, the n-type impurity and p-type impurity are extensively diffused to form, as indicated in FIG. 21, the n+ type semiconductor region 17 on the main surface of well region 2 and the p+ type semiconductor region 18 on the main surface of well region 3. Such extensive diffusion is carried out for about 10 [min] under the temperature as high as about 900~1000 [° C.]. With the process to form the semiconductor region 17, the MISFETQ$_n$ is almost completed and MISFETQ$_p$ is also almost completed by the process to form the semiconductor region 18.

Next, an interlayer insulation film 19 is formed on the entire part of substrate. This interlayer insulation film 19 is formed in the double layer structure wherein a silicon oxide film 19A deposited by the CVD method and a silicon oxide film (BPSG) 19B deposited by the CVD method which allows glass flow are sequentially stacked.

The silicon oxide film 19A as the lower layer is formed to prevent the leak of B and P included in the silicon oxide film 19B to the element of the lower layer and also to acquire the dielectric strength of the part of silicon oxide film 19B formed thin by the glass flow. The silicon oxide film 19A is formed in the thickness, for example, of 500~2000 [Å].

The silicon oxide film 19B as the upper layer is formed to make flat the surface and improve step coverage of the upper layer wiring (21). The silicon oxide film 19B is formed in the thickness, for example, of about 3000~7000 [Å].

Next, the glass flow is executed to the silicon oxide film 19B as the upper layer of the interlayer insulation film 19 to make flat the surface thereof. This glass flow is conducted, for example, in the nitrogen gas ambience at the temperature as high as 900~1000 [° C.].

The interlayer insulation film 19 is selectively removed from the upper part of semiconductor regions 9, 17, 18, the upper part of word line (not illustrated) and the upper part of second electrode layer 15 (not illustrated) to form a connecting hole 19C. The connecting hole 19C is formed by executing the wet etching to the upper part of interlayer insulation film 19 and then executing the anisotropic etching such as RIE to the lower part thereof. This connecting hole 19C is formed in the tapered structure having the larger aperture size at the upper side of interlayer insulation film 19C and smaller aperture size at the lower side in the view of preventing disconnection of upper layer wiring (21). This connecting hole 19C may be formed only by the anisotropic etching.

Next, a silicon oxide film 32 is then formed on the silicon surface such as semiconductor region 9 exposed from the connecting hole 19C. This silicon oxide film 32 is formed to prevent doping of B or P of the silicon oxide film 19B of interlayer insulation film 19 to the main surface of semiconductor region 9 through the connecting hole 19C in the heat processing (extensive diffusion of impurity to form semiconductor region 20) as the successive processing. In case B is doped to the n-type semiconductor regions 9 and 17 and P is doped to the p-type semiconductor region 18, The effective impurity concentration is lowered and a contact resistance between each semiconductor region, and the wiring connected thereto increases.

Figure 22:
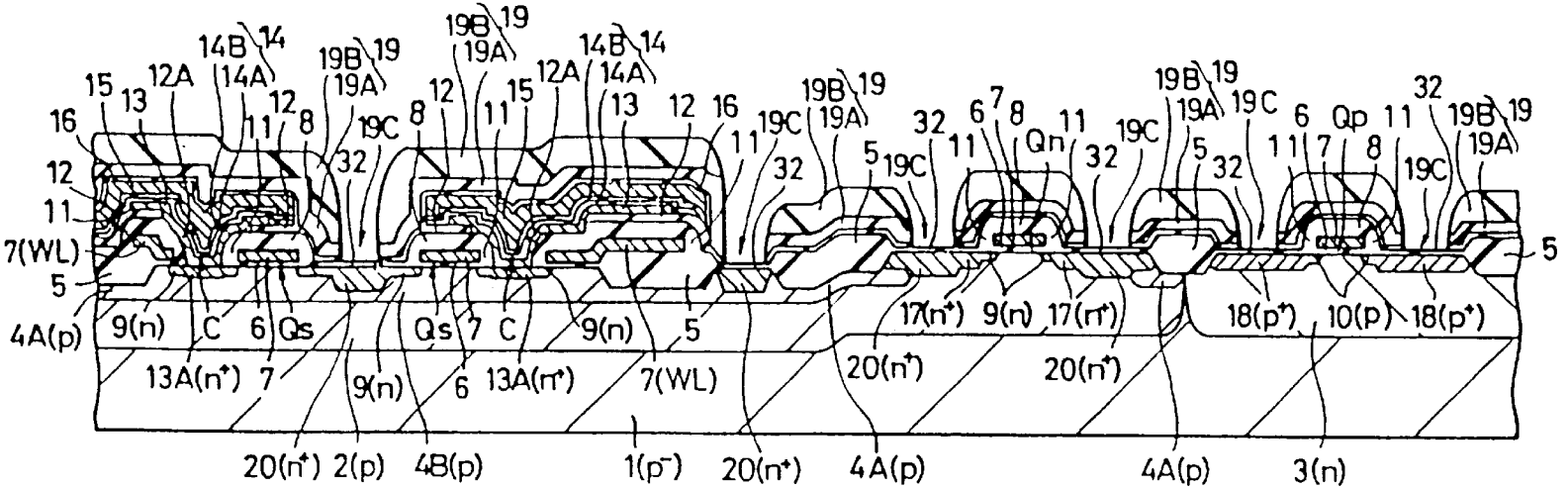

Next, the n-type impurity is selectively doped to the main surface of semiconductor regions 9, 17 through the connecting hole 19C in the memory cell selection MISFETQ$_s$ and n-channel MISFETQ$_n$ forming region. The n-type impurity allows the silicon oxide film 32 to pass. The n+ type semiconductor region 20 of high impurity concentration is formed as indicated in FIG. 22 by extensively diffusing this n-type impurity. The semiconductor region 20 is formed to prevent short-circuit between the wiring (21) laid to the connecting hole 19C and well region 2 in case the semiconductor region 9 or 17 is deviated from the connecting hole 19C in the masking process of the manufacturing process. The n-type impurity is doped by the ion implantation method with an energy of about 110~130 [KeV] using, for example. As of impurity concentration as high as about $10^{15}$ [atoms/cm$^2$]. This semiconductor region 20 is integrally formed with the other semiconductor region 9 of MISFETQ$_s$ in the memory cell M, forming a part of the source region or drain region.

This semiconductor region 20 is formed by the ion implantation of high impurity concentration and thereby can reduce a contact resistance to the complementary data line (21).

Figure 23:
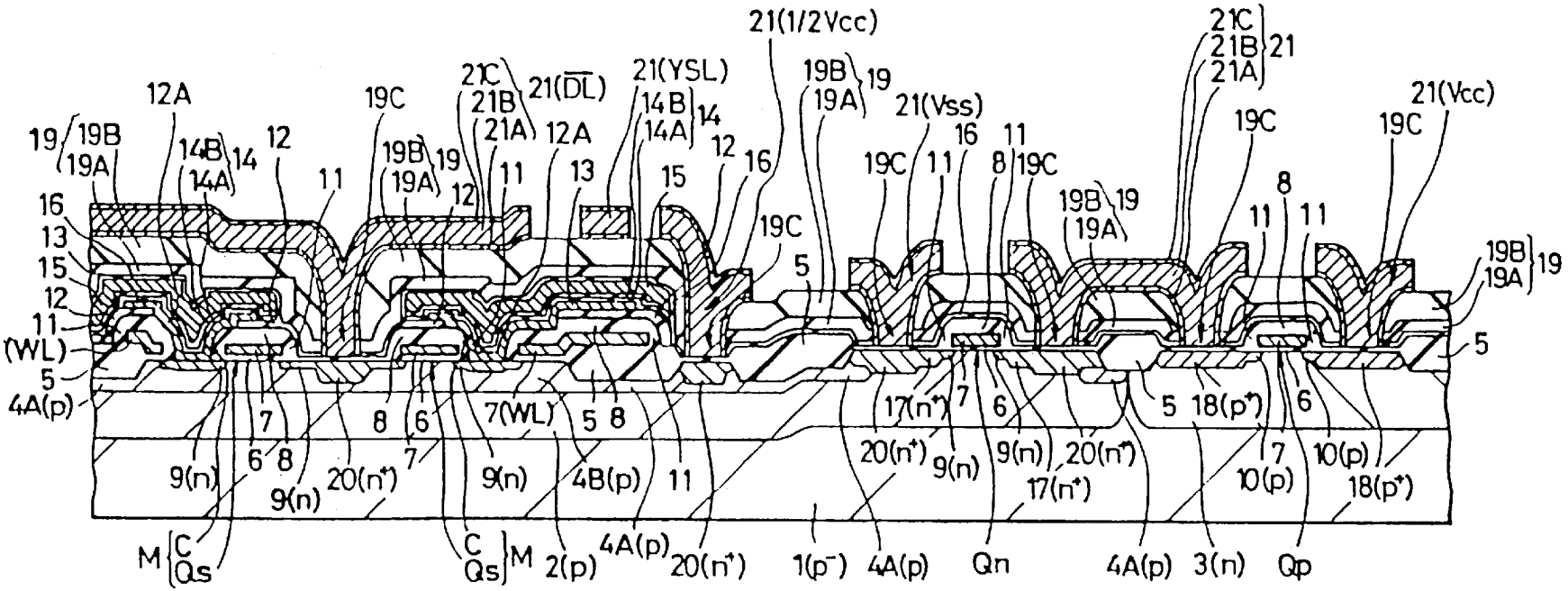

Next, as shown in FIG. 23, the wiring 21 which is connected respectively to the semiconductor regions 9, 17, 18 through the connecting hole 19C and is extending on the interlayer insulation film 19. The wiring 21 is formed in the wiring forming process for the 1st layer and as explained previously, forming the complementary data line 21 and Y select signal line 21. The wiring 21 is formed in the triple layer structure wherein a barrier metal film 21A, an aluminum film 21B and a protection film 21C are sequentially stacked. Moreover, this wiring 21 is patterned by the anisotropic etching such as RIE, etc.

The barrier metal film 21A is formed using $MoSi_2$ deposited by the sputtering in the thickness of about 100~200 [Å]. This barrier metal film 21A is formed to the entire part under the aluminum film 21B and allows doping of Mo to the aluminum film 21B, and thereby suppressing growth of aluminum crystal grain and lowering migration of stress.

The additives such as Cu and Si are added to the aluminum film 21B. This film 21B is deposited by the sputtering in the thickness of about 4000~6000 [Å].

The protection film 21C is formed in the thickness of about 100~1000 [Å] using MoSix (x=0<x<1.2). As explained earlier, this protection film 21C is formed to protect the surface of aluminum film 21B from the liquid used in the wet processing to form the wiring 21.

In the DRAM stacking directly the protection film 21C (upper metal wiring) on the aluminum film 21B of wiring (lower metal wiring), an aluminum film 21B is formed by the sputtering within the vacuum ambience and thereafter a protection film 21C is formed continuously by the sputtering on the aluminum film 21B in the same vacuum ambience. Thereby, generation of aluminum oxide on the surface of aluminum film 21B can be lowered. Accordingly, a specific resistance value of wiring 21 formed by the aluminum film 21B and protection film 21C can be lowered. Reduction of specific resistance value of wiring 21 realizes improvement of operation rate of DRAM.

The wiring mainly comprised of the aluminum film 21B to which an element (Cu, etc.) to reduce migration is added can prevent damage of aluminum film 21 resulting from battery reaction because the aluminum film 21B to which such element is added is formed, a protection film 21C is formed on the aluminum film 21B to protect the film from the liquid used for the wet processing, an etching mask (although not illustrated, etching mask for wiring 21) is formed on the protection film 21C, the protection film 21C and aluminum film 21B are etched to the specified shape using such etching mask, thereafter reaction of the battery formed by aluminum film 21B and a metal compound formed by aluminum and the element mentioned previously can be prevented, on the occasion of etching or wet processing described previously, by executing the wet processing to eliminate etching mask. As a result, the wiring 21 can lower the fault of shape, prevent disconnection thereof and lower migration.

After the process to form the wiring 21 indicated in FIG. 23, an interlayer insulation film 22 is formed to the entire part of substrate including the wiring 21. The interlayer insulation film 22 is formed in the triple layer structure as explained earlier.

The silicon oxide film 22A as the lower layer is formed in the thickness of about 1000~2000 [Å].

The silicon oxide film 22B as the intermediate layer is formed to make flat the surface thereof. The silicon oxide film 22B can be formed by several times (2~5 times) of coating (coated in the thickness of about 1000~2000 [Å] in total) and baking process (about 450 [° C.]) and has the dense film quality. Moreover, the silicon oxide film 22B may be formed in the high quality film by sequentially raising the baking temperature.

The silicon oxide film 22C as the upper layer is formed to enhance film strength of the interlayer insulation film 22 as a whole. The silicon oxide film 22C is formed in the thickness of about 4000~7000 [Å].

Figure 24:
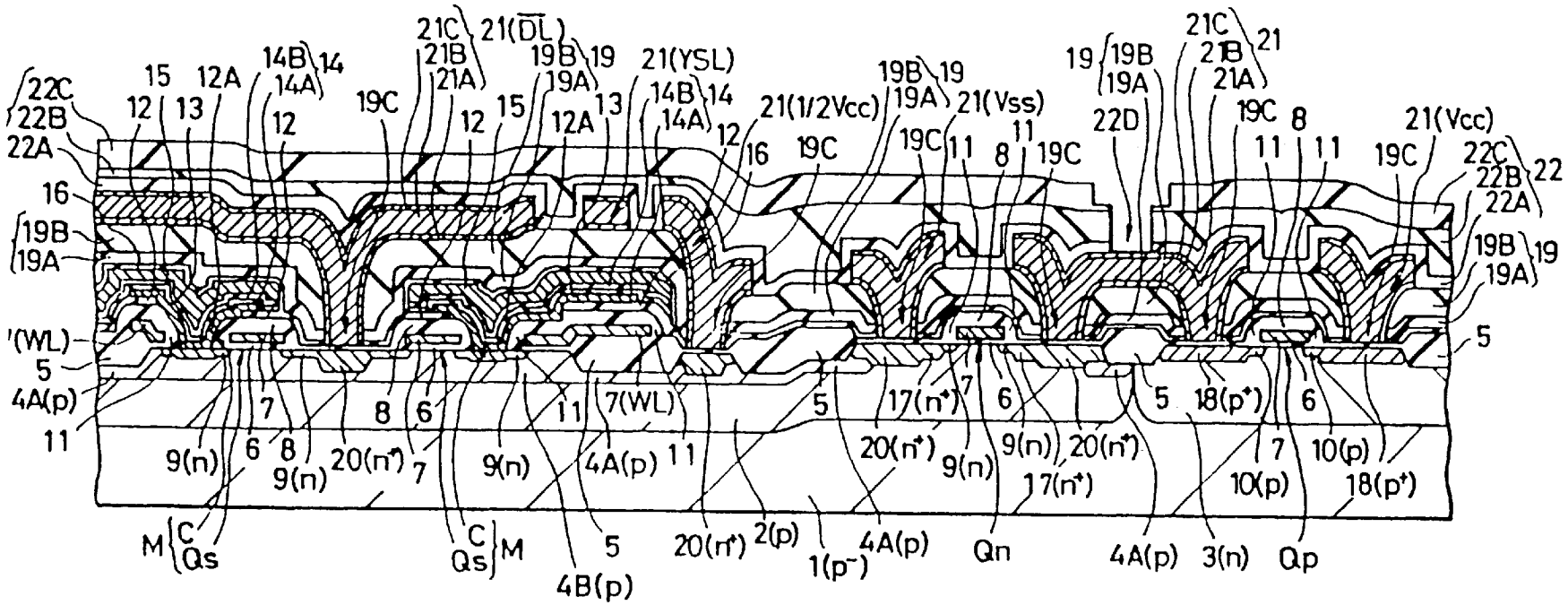
FIGS. 24 to 26 and FIGS. 27 to 30 are other embodiments to form the recessed part on a single crystal substrate.

Next, as indicated in FIG. 24, a connecting hole 22D is formed to the interlayer insulation film 22. The connecting hole 22D is formed in the staircase sectional view by the resist drawback method using the multilayer photoresist film (etching mask) and anisotropic etching such as RIE. Thereafter, the heat processing is carried out under the temperature of about 400 [° C.] in order to recover damage by the etching.

Next, as shown in FIG. 2 and FIG. 3, a wiring 23 is formed by the wiring forming process for the 2nd layer extending on the interlayer insulation film 22 so that it is connected to the wiring 21 through the connecting hole 22D. The wiring 23 is formed, as mentioned above, in the double layer structure wherein the base layer film 23A and aluminum film 23B are sequentially stacked.

The base film 23A as the lower layer is formed by $MoSi_2$ deposited by the sputtering in the thickness of about 100~1000 [Å].

The aluminum film 23B as the upper layer can be deposited by the sputtering in the thickness of about 7000~12000 [Å] thicker than the aluminum film 21B of wiring 21. The aluminum film 23B allows addition of Cu and Si in the same amount as in the case of aluminum film 21B.

As explained previously, since it is prevented that the aluminum oxide is formed by a precipitation of particles of aluminum film 21B of wiring 21 to the interface of protection film 21C and aluminum film 23B through the protection film 21C by providing the protection film 21C (high melting point metal silicide film, MoSix in this embodiment) of which content of silicon is larger than 0 but under 2 (the optimum value is larger than 0 but smaller than 1.2) between the aluminum film 21B of wiring 21 to which an element (Cu) which reduces migration is added and the aluminum film 23B of wiring 23 connected to the aluminum film 21B through the connecting hole 22D formed to the interlayer insulation film 22, a contact resistance between the aluminum film 21B and aluminum film 23B can be reduced. As a result, the yield at the connecting part of wirings 21 and 23 can be improved.

Since a contact resistance value between wirings 21 and 23 can be reduced, the signal transmission rate can be improved and operation rate of DRAM can also be improved.

After the process of forming wiring 23, the heat processing is conducted in order to recover damage by the etching (anisotropic etching) to form the wiring 23.

Next, a passivation film not illustrated is formed to the entire part of substrate including the surface of wiring 23.

The DRAM of the present invention can be completed by conducting a series of these processings.

Embodiment of the present invention has been explained by adopting the present invention to a DRAM, but the present invention can also be adopted to SRAM, EPROM, $E^2$PROM, etc. in addition to DRAM.

FIGS. 23 to 26 indicate another method to form a recessed part on the surface of substrate.

Figure 25:
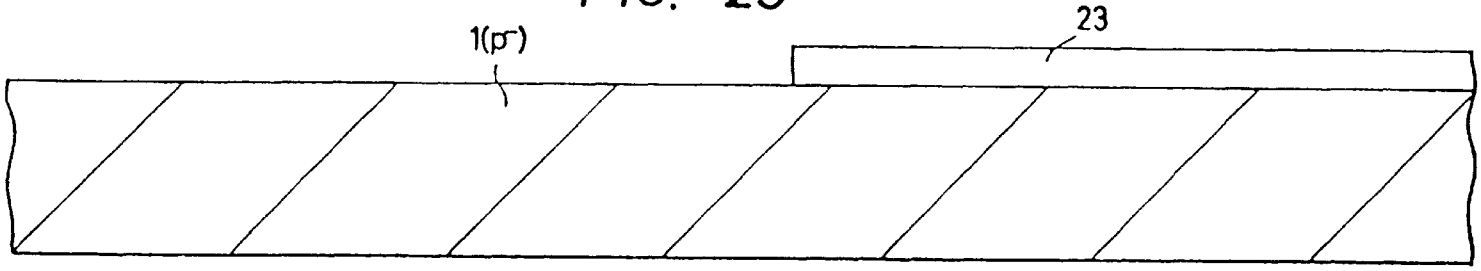
Figure 26:
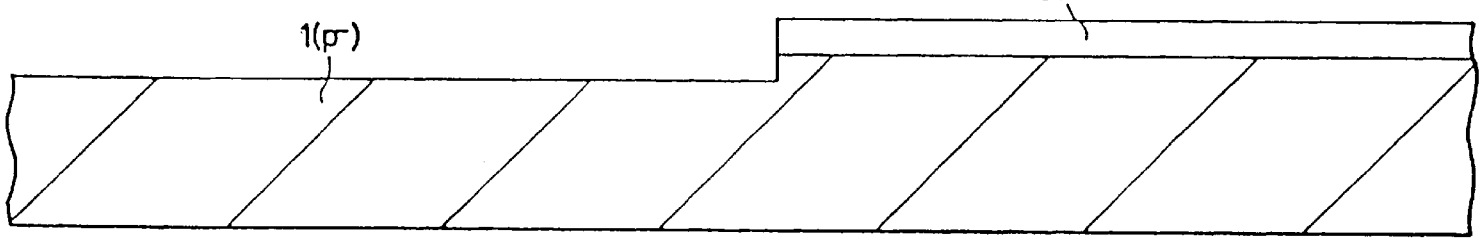

As shown in FIG. 24, a photoresist film 33 is selectively formed to the part other than the memory cell region on the semiconductor substrate 1. Next, as shown in FIG. 25, a recessed part is formed on the semiconductor substrate by executing the dry etching in the $CF_4$+$O_2$ ambience with the photoresist film used as the mask. Thereafter, a semiconductor substrate having a partial recessed part can be prepared by removing the photoresist film used as the etching mask. Although depth of recessed part can be changed freely by changing the etching time, but it is set to 0.6 $\mu$m as in the case of the preceding embodiment.

Figure 27:
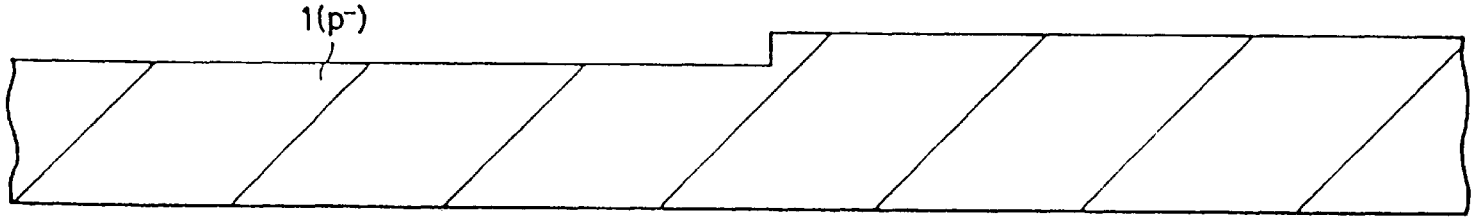
Figure 28:
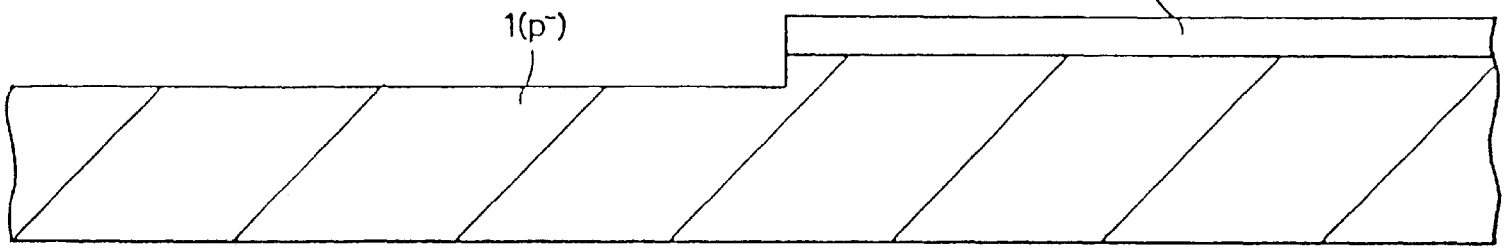
Figure 29:
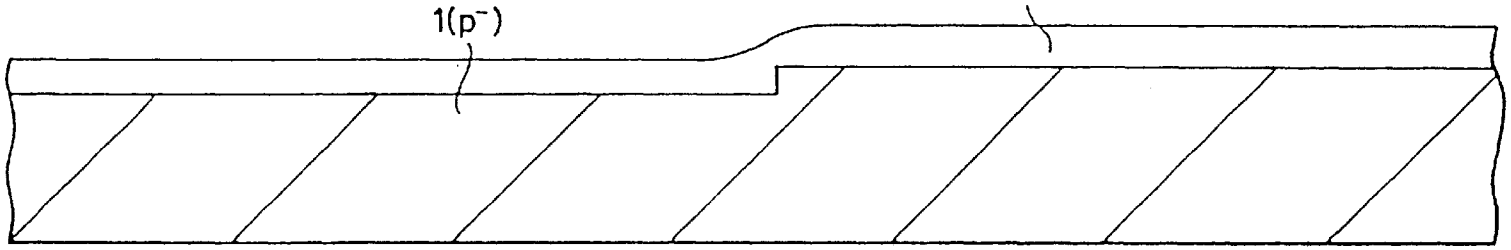
Figure 30:
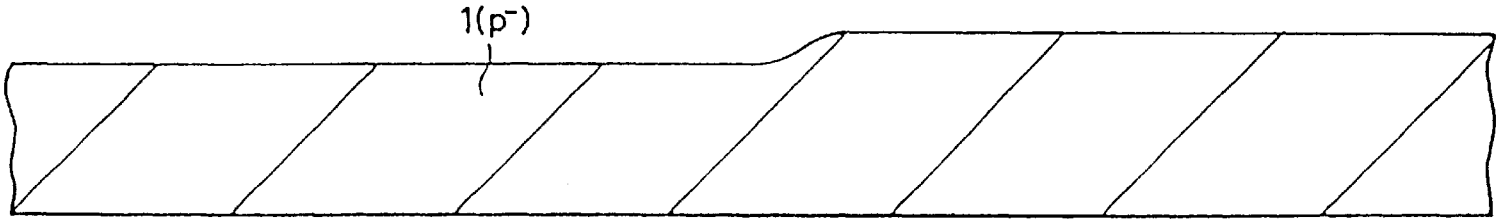

FIGS. 27 to 29 also indicate a method to form a recessed part to the surface of substrate. This method is an improvement of the method explained with reference to FIGS. 24 to 26. As shown in FIG. 27, a recessed part is formed on the semiconductor substrate 1 by the dry etching with the photoresist film 23 used as the mask and the photoresist film 23 is removed. Thereafter, as shown in FIG. 28, the entire part of semiconductor substrate 1 is coated with the photoresist film 24 in the thickness of about 2 μm and is subjected to the heat processing at the temperature of about 200° C. or higher to flow the photoresist film 24.

This photoresist film 24 may be formed with the material such as rubber system material, polyimide film, silicon resin or polysulphone film which shows almost the same etching rate as the semiconductor substrate 1.

Next, a mixed gas of $CF_4$ and $O_2$ is used as the etching gas to conduct dry etching to the surface of photoresist film 24. Since the photoresist film at the stepped portion of semiconductor substrate 1 is thinner than the other region and the stepped portion can be changed to the gradually sloped region by conducting the etching to the entire part.

Thereafter, crystal defect by dry etching on the surface of semiconductor substrate 1 is removed by forming hot silicon oxide film to the surface of semiconductor substrate 1 through the heat processing and removing it with the wet etching and as shown in FIG. 29, a semiconductor substrate 1 (p−) having the stepped portion with gradually sloped surface can be prepared.

Such gradually sloped surface at the stepped portion provides the effect that disconnection of wiring at the stepped portion or short-circuit of wiring by the remainder of etching can be prevented.

In this embodiment, the heat processing temperature for photoresist film 24 is set to 200° C., it is not limited only to this temperature. The higher heat processing temperature results in easier flow and thereby the memory cell portion is connected to the peripheral circuits with more gradual slope. When the photoresist film 24 is irradiated with the ultraviolet ray before the heat processing, flow is more accelerated. Accordingly, irradiation of ultraviolet ray is very effective.

In this embodiment, the entire part of memory cell region is recessed, but it is also effective to form a recessed part only to a part of memory cell. In addition to this method wherein a recessed part is formed, the method wherein the peripheral circuit forming region is previously formed higher than the memory cell region by the selective epitaxial method or the method wherein altitude difference between memory cell and peripheral circuit is made small by forming a dummy pattern to the peripheral circuit part are also effective. In this embodiment a memory is discussed but the method of the present invention digging down previously the region having the high average altitude is effective for formation of ultraminiature pattern even in the integrated circuit having difference in average altitudes not only between the memories but also between the large regions. The average altitude depends on level difference and coarse or fine structure of the region. Therefore, even if level difference is almost the same, if the coarse or fine regions are separated in such a degree as generating difference of altitudes of resist surfaces, ultraminiature patterns may be formed on the coarse and fine structure regions by previously digging down the fine structure region.

As an exposure apparatus, a reduction projection exposure apparatus RA101VL having the characteristics that aperture number of lens (NA) is 0.42, exposing wavelength is 365 nm and image surface distortion is about 1.1 μm. This method of the present invention is also effective to the other apparatuses in addition to this exposure apparatus.

The memory cell is also not limited only to STC and the present invention is also effective to the case wherein there is average altitude difference between the memory cell and peripheral circuit.

In this embodiment, the dry etching is employed for etching of Si but the wet etching having the crystal surface orientation such as hydrazine can also be employed.

According to the present invention, since difference between altitudes of memory cell part and elements of peripheral circuits can be reduced, both regions can be set within the depth of focus of exposure apparatus and thereby ultraminiature pattern can be formed with high accuracy. Accordingly, a chip size can be reduced through formation of elements using more ultraminiature pattern. As a result, a number of chips mounted on a sheet of wafer can be increased, realizing cost down. Moreover, yielding can also be improved through improvement of size accuracy.

What is claimed is:

1. A semiconductor memory comprising:

(a) a semiconductor substrate having a major surface which includes a recessed part and a projected part;

(b) a memory array having a plurality of memory cells, each of which includes a first MISFET of N-type conductivity and a capacitor connected in series, said first MISFET comprising a first gate electrode, first source and drain regions, of n-type conductivity, and said capacitor comprising first and second electrodes and a dielectric film therebetween, wherein said first and second electrodes and said dielectric film are formed over said major surface of said semiconductor substrate and over said first gate electrode of said first MISFET; and (c) a peripheral circuit including a plurality of second MISFETs of N-type conductivity, each having a second gate electrode and second source and drain regions of N-type conductivity[and third MISFETs of P-type conductivity each having a third gate electrode and third source and drain regions of P-type conductivity], wherein said first MISFETs and said capacitors of memory cells are formed on said recessed part of said major surface and said second MISFETs of said peripheral circuit [is] *are* formed on said projected part of said major surface, and wherein an altitude difference between said recessed part and said projected part of said major surface is set to a predetermined value based upon a depth of focus of a predetermined exposure apparatus used for forming said first and second MISFETs so that predetermined areas of both said first and second MISFETs will be [with] *within* said depth of focus of the predetermined exposure apparatus to permit simultaneous processing of said predetermined areas of said first and second MISFETs during formation of said first and second MISFETs.

2. A semiconductor memory according to claim 1, wherein said plurality of memory cells are arranged in row and column directions.

3. A semiconductor memory according to claim 2, wherein said memory array further includes a plurality of word lines extending in a row direction.

4. A semiconductor memory according to claim 3, wherein *each of* said first gate electrodes arranged in [a] *said* row direction are integral with *a corresponding* one of said word lines.

5. A semiconductor memory according to claim 4, wherein said memory array further includes a plurality of further word lines extending in [a] *said* row direction and connected to said word lines.

6. A semiconductor memory according to claim 5, wherein said plurality of further word lines are formed over said first and second electrodes of said capacitors.

7. A semiconductor memory according to claim 5, wherein said peripheral circuit further includes wiring lines formed over said second and third gate electrodes, and wherein said wiring lines are formed of the same layer as that of said further word lines.

8. A semiconductor memory according to claim 7, wherein said wiring lines are comprised of an aluminum layer.

9. [a] *A* semiconductor memory according to claim 1, wherein said memory array further includes a plurality of data lines extended in a column direction and respectively connected to predetermined ones of said *first* source and drain regions, and wherein said data lines extend over said first and second electrodes of said capacitors.

10. A semiconductor memory according to claim 9, wherein said peripheral circuit further includes *a* further wiring [lines] *line* formed over said second gate electrode, and wherein said further wiring [lines are] *line is* formed of the same layer *level* as that of said data lines.

11. A semiconductor memory according to claim 10, wherein said further wiring [lines are] *line is* comprised of an aluminum layer.

12. A semiconductor memory according to claim [1] *22*, further comprising [an] *a second* insulating film formed between said second drain region of said second MISFET and said third drain region of said third MISFET.

13. A semiconductor memory according to claim [1] *22*, further comprising a P-type well region and an N-type well region formed in said semiconductor substrate, wherein said second MISFET is formed in said P-type well region and said third MISFET is formed in said N-type well region.

14. A semiconductor memory comprising:

(a) a semiconductor substrate having a major surface which includes a recessed part and a projected part;

(b) a memory array having a plurality of data lines extending in column direction, a plurality of word lines extending in a row direction and a plurality of memory cells including first MISFETs of N-type conductivity; and (c) a peripheral circuit having a plurality of second MISFETs of N-type conductivity, third MISFETs of P-type conductivity, and first wiring lines formed [by the same layer as said data lines and] over said second and third MISFETs, *wherein said first wiring lines and the data lines are formed at the same wiring layer level*, wherein said first MISFETs are formed on said recessed part of said major surface and said [second] *second and third* MISFETs are formed on said projected part of said major surface, and wherein an altitude difference between said recessed part and said projected part of said major surface is set to a predetermined value based upon a depth of focus of a predetermined exposure apparatus used for forming said [first and second] *first, second and third* MISFETs so that predetermined areas of [both] said [first and second] *first, second and third* MISFETs will be within said depth of focus of the predetermined exposure apparatus to permit simultaneous processing of said predetermined areas of said [first and second] *first, second and third* MISFETs during formation of said [first and second] *first, second and third* MISFETs.

15. A semiconductor memory according to claim 14, wherein *each of* said data lines and *each of* said first wiring lines are comprised of an aluminum layer.

16. A semiconductor memory according to claim 14, wherein said peripheral circuit further having second wiring lines formed by the same layer *level* as said word lines.

17. A semiconductor memory according to claim 16, wherein *each of* said word lines and *each of* said second wiring lines are comprised of an aluminum layer.

18. A semiconductor memory according to claim 14, further comprising an insulating film formed between a drain region of *one of* said second [MISFET] *MISFETs* and a *drain* region of *one of* said third [MISFET] *MISFETs*.

19. A semiconductor memory according to claim 14, further comprising a P-type well region and an N-type well region formed in said semiconductor substrate, wherein *one of* said second [MISFET] *MISFETs* is formed in said P-type well region and *one of* said third [MISFET] *MISFETs* is formed in said N-type well region.

20. A semiconductor memory comprising:

(a) a semiconductor substrate having a major surface which includes a recessed part and a projected part;

(b) a memory array having a plurality of memory cells each of which includes a first MISFET and a capacitor connected in series, said first MISFET comprising a first gate electrode, a first source region and a first drain region, and said capacitor comprising first and second electrodes and a dielectric film therebetween, wherein said first and second electrodes and said dielectric film are formed over said major surface of said semiconductor substrate and over said first gate electrode of said first MISFET; and (c) a peripheral circuit including a plurality of second MISFETs, each having a second gate electrode and a second source region and a second drain region, wherein said first MISFETs and said capacitors of memory [cell] *cells* are formed on said recessed part of said major surface and said second MISFETs of said peripheral circuit are formed on said projected part of said major surface, and further wherein an altitude difference between said recessed part and said projected part of said major surface is set to a predetermined value based upon a depth of focus of a predetermined exposure apparatus used for forming said first and second [MISFET] *MISFETs* so that predetermined areas of both said first and second MISFETs will be within said depth of focus of the predetermined exposure apparatus to permit simultaneous processing of said predetermined areas of said first and second [MISFET] *MISFETs* during formation of said first and second MISFETs.

21. A semiconductor memory comprising:

(a) a semiconductor substrate having a major surface which includes a recessed part and a projected part;

(b) a memory array having a plurality of data lines extending in column direction, a plurality of word lines extending in row direction and a plurality of memory cells including first MISFETs; and (c) a peripheral circuit having a plurality of second MISFETs and first wiring lines formed [by the same layer as said data lines and] over said second MISFETs, *wherein the first wiring lines and the data lines are formed at the same wiring layer level,* wherein said first MISFETs are formed on said recessed part of said major surface and said second MISFETs are formed on said projected part of said major surface, and further wherein an altitude difference between said recessed part and said projected part of said major surface is set to a predetermined value based upon a depth of focus of a predetermined exposure apparatus used for forming said first and second MISFETs so that predetermined areas of both said first and second MISFETs will be within said depth of focus of the predetermined exposure apparatus to permit simultaneous processing of said predetermined areas of said first and second MISFETs during formation of said first and second MISFETs.

*22. A semiconductor integrated circuit device comprising:*

*(a) a semiconductor substrate having a major surface which includes a recessed part and a projected part;*

*(b) a first layer level of conductive film including first conductive strips arranged in said recessed part and said projected part;*

*(c) a plurality of layer levels of conductive films formed between said recessed part of said major surface of said semiconductor substrate and said first layer level of conductive film, wherein at least one layer level of said plurality of layer levels of conductive films has second conductive strips formed only in said recessed part; and*

*(d) a plurality of memory cells each having a MISFET and a capacitor element arranged in said recessed part.*

*23. A semiconductor integrated circuit device according to claim 22, wherein said capacitor elements each have a first electrode and a second electrode and a dielectric film formed therebetween, and wherein said second conductive strips form one of said first and second electrodes.*

*24. A semiconductor integrated circuit device comprising:*

*(a) a semiconductor substrate having a first portion and a second portion, said first portion having a first level of main surface and said second portion having a second level of main surface which is higher than said first level of said main surface; wherein*

*each of the first portion and the second portion of the semiconductor substrate includes a p-type well region;*

*(b) first conductive strips formed above the p-type well in said first portion, each of said first conductive strips having a third level, and second conductive strips formed above the p-type well in said second portion, each of said second conductive strips having a fourth level, wherein said first and second conductive strips are formed by patterning a first conductive film; and*

*(c) third conductive strips formed over said first conductive strips above said p-type well in said first portion, each of said third conductive strips having a fifth level, and fourth conductive strips formed over said second conductive strips above said p-type well in said second portion, each of said fourth conductive strips having a sixth level, wherein said third and fourth conductive strips are formed by patterning a second conductive film,*

*wherein a level difference between each of the third conductive strips and each of the first conductive strips is larger than a level difference between each of said fourth conductive strips and each of said second conductive strips.*

*25. A semiconductor integrated circuit device according to claim 24, wherein said first conductive film comprises a polycrystalline silicon film.*

*26. A semiconductor integrated circuit device according to claim 25, further comprising MISFETs formed in said first and second portions, wherein said first and second conductive strips form gate electrodes of said MISFETs.*

*27. A semiconductor integrated circuit device according to claim 26, wherein said second conductive film comprises an aluminum film.*

*28. A semiconductor integrated circuit device according to claim 24, further comprising a third conductive film formed between said first and second conductive films, wherein fifth conductive strips are comprised of said third conductive film,*

*wherein said fifth conductive strips are only formed in said first portion.*

*29. A semiconductor integrated circuit device according to claim 24, wherein the p-type well in the first portion and the p-type well in the second portion comprises a continuous p-type well which extends in both the first portion and the second portion.*

*30. A semiconductor memory having memory cells and a peripheral circuit comprising:*

*(a) a semiconductor substrate having a major surface which includes a recessed part and a projected part;*

*(b) first MISFETs each comprising a first gate electrode formed on said major surface of said semiconductor substrate and a first source region and a first drain region in said semiconductor substrate, and capacitor elements each comprising a first electrode connected to one of said first source region and said first drain region, a second electrode and a dielectric film therebetween, each of said memory cells including at least one of said first MISFETs and at least one of said capacitor elements;*

*(c) second MISFETs each comprising a second gate electrode formed on said major surface of said semiconductor substrate and a second source region and a second drain region in said semiconductor substrate, said peripheral circuit including at least two of said second MISFETs;*

*(d) a first insulating film formed on said first MISFETs, said capacitor elements and said second MISFETs; and*

*(e) first conductive strips arranged on said first insulating film, wherein a first group of said first conductive strips extends over said capacitor elements and a second group of said first conductive strips electrically connects said second MISFETs to each other,*

*wherein said first and second electrodes and dielectric film of each of said capacitor elements are formed over a corresponding first gate electrode of a corresponding one of said first MISFETs, and*

*wherein said first MISFETs and capacitor elements of said memory cells are formed in said recessed part of said major surface and said second MISFETs of said peripheral circuit are formed in said projected part of said major surface.*

*31. A semiconductor memory according to claim 30, further comprising:*

*word lines integrally formed with said first gate electrodes, and extending substantially in parallel with each other.*

*32. A semiconductor memory according to claim 31, further comprising:*

*data lines each connected to the other of said first source region and said first drain region, and extending substantially in parallel with each other, said data lines intersecting said word lines.*

*33. A semiconductor memory according to claim 32, wherein said data lines are comprised of said first group of conductive strips.*

*34. A semiconductor memory according to claim 31, further comprising:*

*a second insulating film formed on said first conductive strips; and*

*second conductive strips formed on said second insulating film, at least one of said second conductive strips extending over at least one of said capacitor elements and another one of said second conductive strips being*

*electrically connected to said second group of said first conductive strips.*

*35. A semiconductor memory according to claim 34, wherein a group of said second conductive strips form further word lines electrically connected to said word lines.*

*36. A semiconductor memory according to claim 35, wherein each of said second conductive strips is comprised of aluminum film.*

*37. A semiconductor memory having a memory cell and a peripheral circuit, comprising:*

(*a*) *a semiconductor substrate having a major surface which includes a recessed part and a projected part;*

(*b*) *a first MISFET comprising a first gate electrode formed over said major surface of said semiconductor substrate and a first source region and a first drain region of N-type conductivity formed in said semiconductor substrate, and a capacitor element comprising a first electrode connected to one of said first source region and said first drain region, and a second electrode and a dielectric film therebetween, said memory cell including said first MISFET and said capacitor element;*

(*c*) *a second MISFET comprising a second gate electrode formed over said major surface of said semiconductor substrate and a second source region and a second drain region of N-type conductivity formed in said semiconductor substrate, and a third MISFET having a third gate electrode formed over said major surface of said semiconductor substrate and a third source region and a third drain region of p-type conductivity formed in said semiconductor substrate, said peripheral circuit including said second MISFET and said third MISFET;*

(*d*) *a first insulating film formed over said first MISFET, said capacitor element, said second MISFET and said third MISFET; and*

(*e*) *a first conductive strip and a second conductive strip arranged on said first insulating film, wherein said first conductive strip extends over said capacitor element and said second conductive strip electrically connects said second MISFET and said third MISFET,*

*wherein said first and second electrodes and dielectric film of said capacitor element are formed over said first gate electrode of said first MISFET, and*

*wherein said first MISFET and capacitor element of said memory cell are formed in said recessed part of said major surface and said second MISFET and said third MISFET of said peripheral circuit are formed in said projected part of said major surface.*

*38. A semiconductor memory according to claim 37, further comprising:*

*a word line integrally formed with said first gate electrode.*

*39. A semiconductor memory according to claim 38, further comprising:*

*a data line connected to the other of said first source region and said first drain region, said data line intersecting said word line.*

*40. A semiconductor memory according to claim 39, wherein said data line is comprised of said first conductive strip.*

*41. A semiconductor memory according to claim 38, further comprising:*

*a second insulating film formed over said first conductive strip and said second conductive strip; and*

*a third conductive strip and a fourth conductive strip arranged on said second insulating film, said third conductive strip extending over said capacitor element and said fourth conductive strip being connected to said second conductive strip.*

*42. A semiconductor memory according to claim 41, wherein said third conductive strip constitutes a further word line electrically connected to said word line.*

*43. A semiconductor memory according to claim 42, wherein said third conductive strip and said fourth conductive strip are comprised of aluminum film.*

*44. A semiconductor memory according to claim 37, further comprising a P-type well region and an N-type well region formed in said semiconductor substrate, wherein said second MISFET is formed in said P-type well region and said third MISFET is formed in said N-type well region.*

* * * * *